US007830926B1

(12) United States Patent  
Kim

(10) Patent No.: US 7,830,926 B1  
(45) Date of Patent: Nov. 9, 2010

(54) TUNABLE DEVICE, METHOD OF MANUFACTURE, AND METHOD OF TUNING A LASER

(76) Inventor: Matthew H. Kim, 15560 N. Frank Lloyd Wright Blvd., Suite B-4-405, Scottsdale, AZ (US) 85260

( * ) Notice: Subject to any disclaimer, the term of this patent is extended or adjusted under 35 U.S.C. 154(b) by 0 days.

(21) Appl. No.: 11/938,637

(22) Filed: Nov. 12, 2007

Related U.S. Application Data

(60) Provisional application No. 60/865,610, filed on Nov. 13, 2006.

(51) Int. Cl.
*H01S 3/10* (2006.01)
(52) U.S. Cl. .......................... 372/20; 372/9; 372/29.02
(58) Field of Classification Search .................. 372/20, 372/29.02
See application file for complete search history.

(56) References Cited

U.S. PATENT DOCUMENTS

| 6,654,392 | B1 * | 11/2003 | Arbore et al. ................. 372/20 |
| 2003/0012249 | A1 * | 1/2003 | Eisenbeiser ................. 372/96 |

OTHER PUBLICATIONS

Adamiec et al. (submitted IDS: Pressured-tuned InGaAsSb/ AlGaAsSb diode laser with 700 nm tuning range Article), Nov. 2004.*

Adamiec, et al.; "Pressure-tuned InGaAsb/AlGaAsSb diode laser with 700 nm tuning range", Appl. Phys. Lett., 2004, vol. 85, pp. 4292-4294.
Mailhiot, et al.; "Effects of Compressive Uniaxial Stress on the Electronic Structure of . . . "; American Physical Society; 1987, vol. 36(5), pp. 2942-2945.
Yablonovitch et al.; "Extreme Selectivity in the lift-off of Epitaxial GaAs films", Appl. Phys. Lett., 1987, vol. 51(26), pp. 2222-2224.
Yablonovitch, et al.; "Van der Waals Bonding of GaAs . . . " Appl. Phys. Lett., 1990, vol. 56(24), pp. 2419-2421.

* cited by examiner

*Primary Examiner*—Dung T Nguyen
(74) *Attorney, Agent, or Firm*—Bryan Cave LLP

(57) ABSTRACT

This description relates to an apparatus, a method of manufacturing, and a method of tuning optical and/or electrical parameters of semiconductor devices and materials, thin film materials, or other devices. In one example, a laser is tuned to produce an adjustable output wavelength by coupling the laser to a tuning material or base such as, for example, a piezoelectric base using a suitable attachment method. The laser includes of a tunable material that is sensitive to stress and/or strain. Stress and/or strain applied to the laser from the tuning material results in an electronically variable output wavelength. As an example, applying a voltage to a piezoelectric base that serves as a tuning material can cause the base to expand or contract, and the expansions and contractions from the base are coupled to the tunable material of the laser, thus varying the wavelength of the output light from the laser. Additionally, other devices that are sensitive to stress and/or strain can be adjoined in a similar manner and can result in an electronically variable output of the devices. Examples of other examples are disclosed herein.

25 Claims, 23 Drawing Sheets

Tuning Material Properties 1000A

Epitaxial layer liftoff/bonding technique 1200

Electrical modulator with tunable laser assembly
2020

Optical modulator with tunable laser assembly
2030

TUNABLE DEVICE, METHOD OF MANUFACTURE, AND METHOD OF TUNING A LASER

CROSS-REFERENCE TO RELATED APPLICATION

This application claims the benefit of U.S. Provisional Patent Application No. 60/865,610 filed Nov. 13, 2006, the contents of which are hereby incorporated by reference.

TECHNICAL FIELD

This description relates generally to adjusting output parameters of a device and more particularly to apparatuses and methods of tuning optical and electrical parameters of semiconductor devices and materials, or thin film materials or other devices.

BACKGROUND

Lasers are devices that can produce intense narrowly divergent, substantially single wavelength (monochromatic), coherent light. Laser light of different wavelengths can be advantageously applied in many fields, including biological, medical, military, space, industrial, commercial, computer, and telecommunications.

Semiconductor lasers may utilize an active region, which may be formed with a homojunction (using similar materials), single or double heterojunction using dissimilar materials), or with a quantum well ("QW") or quantum cascade region. The quantum well structure may be formed when a low energy bandgap semiconductor material is typically positioned between two large bandgap semiconductor materials.

In order for lasing to occur, a laser device typically has a resonant cavity and a gain medium to create population inversion. In highly efficient semiconductor lasers, population inversion generally occurs with the injection of electrical carriers into the active region, and the resonant cavity is typically formed by a pair of mirrors that surround the gain medium. The method of injection of carriers can be divided into electrical injection of carriers and optical pumping for injection of carriers. Electrical injection is generally performed by an electrical current or voltage biasing of the laser. Optical pumping typically uses incident radiation that will allow the formation of electrons and holes in the laser. Additionally these methods can be operated in a continuous wave (CW) pulsed, synchronous or asynchronous modes.

Two common types of semiconductor lasers are in-plane, also known as edge emitting or Fabry Perot lasers, and surface emitting also known as vertical cavity surface emitting lasers ("VCSELs"). Edge emitting lasers emit light from the edge of the semiconductor wafer. In addition the resonant cavity is typically formed with cleaved mirrors at each end of the active region. The second type of semiconductor laser, VCSELs, emits light normal to the surface of the semiconductor wafer. The resonant optical cavity of a VCSEL may be formed with two sets of distributed Bragg reflector mirrors located at the top and bottom of the laser structure. The fundamental wavelength that characterizes quantum well and quantum cascade lasers is determined primarily by the thickness, composition and material of the quantum well.

However these lasers are typically limited to primarily one wavelength, thus the ability to create one laser that can produce many different wavelengths controllably and accurately could be very useful for many applications, such as in the field of telecommunications. A tunable laser could also be very useful in high data rate telecommunications applications like dense wavelength division multiplexing, which may be used in fiber optic communications.

Figure 1:
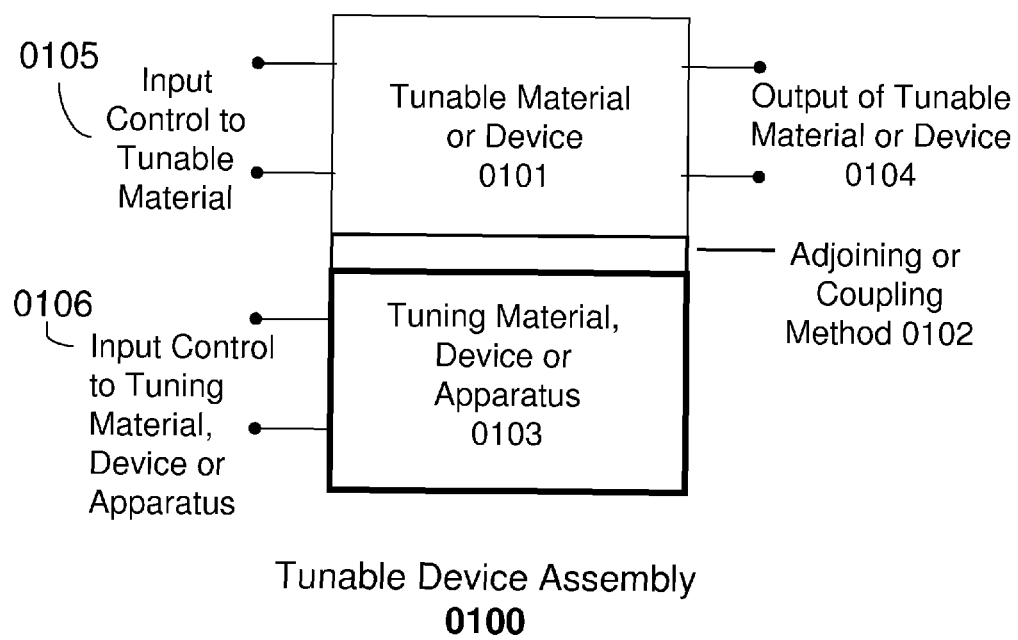
FIG. 1 shows a tunable device assembly.

For simplicity and clarity of illustration, the drawing figures illustrate the general manner of construction, and descriptions and details of well-known features and techniques may be omitted to avoid unnecessarily obscuring the examples of the invention. Additionally, elements in the drawing figures are not necessarily drawn to scale. For example, the dimensions of some of the elements in the figures may be exaggerated relative to other elements to help improve understanding of the examples presented. Like reference numerals are used to designate like parts in the accompanying drawings.

DETAILED DESCRIPTION

The description below describes the tuning of the output of a device by the application of a stress and/or strain on the device. The examples below include descriptions of examples of a tunable laser, methods for producing a tunable laser, methods for tuning a laser, and systems that may use a tunable laser. In particular this description presents examples of a generalized apparatus and method of tuning optical and electrical parameters of semiconductor devices and materials or thin film materials or devices (where thin film may refer to polymer, liquid crystal, organic materials or the like). Some examples specifically describe tuning the wavelength of light emitted from semiconductor lasers in a controllable and predictable manner. However it is contemplated that the techniques described below may also be applied to varying other parameters that are sensitive to stress/strain, for example possibly varying the gain of a transistor where the gain is sensitive to pressure applied to the semiconductor material.

Some of the examples described disclose a unique apparatus and method for making a monolithic or compact tunable wavelength laser. The examples disclosed may provide two functions, 1) production of laser light and 2) a way of tuning the laser light produced within the semiconductor laser itself. These examples typically show that it may be possible to eliminate an external cavity that might be used to tune the wavelength in conventional systems, thus providing tunability of a semiconductor laser in a monolithic or compact manner. Also these examples typically provide a relatively temperature insensitive method of tuning the wavelength of the laser, which usually allows for very fast wavelength changes.

In conventional systems a variety of wavelengths can be produced in a controllable manner from a single laser source when two components are used 1) a laser to produce laser light characterized by a fundamental wavelength and 2) a separate external cavity to change the wavelength of the laser light. The external cavity in current technologies has generally resulted in increased costs, process complexity, and size.

In the present examples the wavelength of the light emitted from the active region of the semiconductor laser can be varied away from the fundamental wavelength of the laser without an external resonant cavity. Thus the tuning of the wavelength may be achieved by a tuning device in typically integral or in close contact with the semiconductor laser device. Because external tuning is not needed, the tunable laser may be close to the size and dimension of the semiconductor laser. Also, such a compact device tends to be cost effective and economical to produce. The tunable laser may employ an exemplary laser which can be coupled to a tuning material, such as an exemplary piezoelectric base, a mechanical pressure or stress system, a Micro-Electro-Mechanical Systems ("MEMS"), a magneto-elastic, micro-fluidics or equivalent, by use of a suitable bonding, coupling or adjoining method. For example by applying a voltage to the piezoelectric base, expansion and contractions can be created, which may be coupled to the semiconductor laser, thus altering the emitted wavelength of light. Many of the attendant features will be more readily appreciated as the same becomes better understood by reference to the following detailed description considered in connection with the accompanying drawings.

The detailed description provided below in connection with the appended drawings is intended as a description of the present disclosure and is not intended to represent the only forms in which the examples may be constructed or utilized. The description sets forth the functions of the examples and the sequence of steps for constructing and operating the example. However, the same or equivalent functions and sequences may be accomplished by different examples.

The examples described in the following, may provide a way of changing the wavelength of light emitted from the active region of a semiconductor laser in a continuous manner. Tuning of the wavelength may be accomplished within the laser, without need for external cavities and the like. The controllable output wavelength of the tunable laser as described and the method of tuning are typically not limited to semiconductor lasers. The concepts presented herein are suitable for application in a variety of semiconductors, thin film devices and systems, transistors, light emitting diodes (semiconductor or polymer or organic), dielectrics, and the like as a tunable device implementation.

Thus the tunable device concept may not be limited to tuning the wavelength of emitted light. The tunable laser or tunable device can, by introducing stress and/or strain, be used to tune other parameters such as the gain of transistors, the phase in integrated waveguides, the dielectric constants and other electronic, magnetic and optical parameters that are affected by stress-strain in semiconductor or thin film materials. Also, tunable lasers would be useful in commercial and military range finding applications such as laser detection and ranging (LADAR). In short the techniques described may be used to produce tunable devices that alter outputs in response to a mechanically applied stress and or strain, and in particular to stresses and/or strains applied through an electronically tunable piezoelectric tuning material. In particular it is typically known that piezoelectric materials can allow fine mechanical movement in the angstrom range verses typically available sensitivities in the micron or millimeter range. As used herein, the term "stress-strain" includes stress and/or strain. Furthermore, stress includes, but is not limited to, pressure from hydrostatic pressure, other hydrofluidic effects, and other microfluidic effects.

FIG. 1 illustrates one example of a block diagram of a tunable device assembly 0100, which includes a tunable material or device 0101 that is responsive to the application of stress-strain, and a tuning material, device or apparatus 0103 which is capable of temporary mechanical deformation in response to a particular input control to the tuning material or apparatus 0106. Typically the tunable material or device 0101 is controlled by the input control 0105 and in response to the input control causes the tunable material or device 0101 to produce an output of the tunable material or device 0104. Typically if the input control 0105 to the tunable material or device 0101 is unchanged, the output of the tunable material or device 0104 may remain unchanged. It may be possible by an adjoining or coupling method 0102 to intimately couple the tunable material or device 0101 to the tuning material, device or apparatus 0103. Once the tunable material or device 0101 is coupled to the tuning material, device, or apparatus 0103, it may be possible to in a very controllable manner change the output of the tunable device or material 0104 in prescribed manner, with out changing the input to the tunable material 0105. The tunable material or device 0101 may include a semiconductor laser, transistor, or light emitting diode ("LED"), or any material or device that is capable of being tuned with application of a mechanical deformation.

To further describe this example, coupled or disposed on to the tuning material, device or apparatus 0103 is the tunable material or device 0101. The adjoining or coupling method 0102 may intimately transfer any, all, or only a portion of stress-strains from the tuning material, device, or apparatus 0103 to the tunable material or device 0101. Thus the tuning material or device or apparatus 0103 produces mechanical deformation that may be directly transmitted to the tunable material or device 0101. The tuning material, device or apparatus 0103 may be for example any material, device or assembly capable of producing a mechanical deformation, for example a strain actuator such as a piezoelectric material, or its equivalent may be used. The mechanical deformation typically provided to the tunable material or device 0101 may be stress, strain, or combination of stress and strains. Thus systems, devices and methods have been devised that typically directly affect the stress-strain dependent characteristics of the device or laser of interest which additionally may allow the possible formation of a monolithic or compact device with the ability to tune the output parameters of the device in a controllable manner thus forming a new type of tunable device.

The materials of the tunable material or device 0101 and the tuning material, device or apparatus 0103 which may be substantially dissimilar, are attached, coupled or bonded by an adjoining method 0102 so that the mechanical deformation induced in the tuning material, device or apparatus 0103 may be transmitted to tunable material or device 0101. Adjoining dissimilar materials 0102 may be accomplished by an epitaxial lift-off process, wafer bonding, gluing, mechanical pressure, clamping of the materials, chemical bonding, direct deposition of tunable material 0101 on tuning material 0103, or other equivalent processes. These examples are not limited to those in which the tunable material is in direct contact with the tuning material or device, because alternative examples that include those having a separate coupling are encompassed by this description but not explicitly shown here.

The tunable device assembly 0100 may be activated with an input to the tunable material 0105, such as a bias voltage or current, mechanical bias or other ways to activate the device. Secondly a way of deforming the tuning material, device or apparatus 0103 is applied, which may include the application of an input control 0106 to the tuning material. The input control may be a voltage, current, magnetic field, mechanical pressure, or any input control that allows for the control of the tuning device. Because the device and the tuning material may be intrinsically attached or coupled, the input control to tuning material 0106 may be intended to transfer the deformation to the tunable material or device 0101, such that the characteristic parameters of the device are altered producing a tunable output 0104, with out changing the input to the tunable material 0105. The maximum change in the output of tunable material or device 0104 may be dependent on the internal material or device properties of the tunable material or device 0101 and its sensitivity to the stress and strain applied to it. A more closely controlled stress-strain that is applied to the tuning material, device or apparatus 0103 may result in more precise control of the output of tunable material or device 0104.

In a first example, the tunable material or device 0101 outputs the tunable output 0104 before the input control 0106 is applied to the tuning material, device, or apparatus 0103, and the tunable material or device 0101 generates a tuned or otherwise different tunable output 0104 after the input control 0106 is applied to the tuning material, device, or apparatus 0103 and after at least a portion of the stress-strain from the tuning material, device, or apparatus 0103 is transferred to the tunable material or device 0101. In a second example, the tunable material or device 0101 outputs the tunable output 0104 only after the input control 0106 is applied to the tuning material, device, or apparatus 0103 and only after at least a portion of the stress-strain from the tuning material, device, or apparatus 0103 is transferred to the tunable material or device 0101. In both examples, the tunable output 0104 can be considered to be "varied," "changed," and/or "adjusted."

Figure 2:
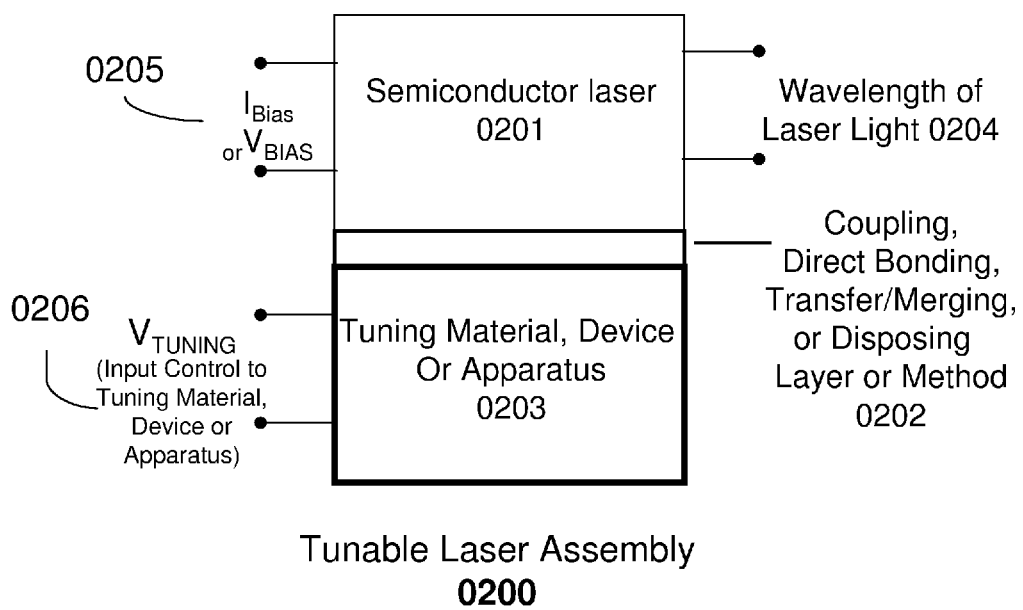
FIG. 2 shows tunable laser assembly.

FIG. 2 shows a block diagram of a tunable laser assembly 0200 which may include a semiconductor laser 0201 capable of being tuned by application of a mechanical deformation. In another example, the laser may be a semiconductor quantum well ("QW") laser.

A tuning material, device, or apparatus 0203 (hereafter referred to tuning material 0203) is coupled to the laser 0201 by a coupling, direct bonding, transfer/merging, or disposing layer or method 0202, or equivalent. The tuning material may be a strain actuator such as a piezoelectric, a mechanical apparatus for deformation, a magnetic device, a micro-electro-mechanical device, microfluidic device or other equivalent material. The tuning material 0203 may be used to produce a mechanical deformation that may be transferred to the semiconductor laser 0201. The mechanical deformation may be impressed upon the device through various forces including mechanical, electrical, magnetic, a combination of forces, and the like. The mechanical deformation from the tuning material 0203 is intended to provide stress, strain, or combination of stress and strain through the coupling method 0202 to the laser 0201 to change the output wavelength of the laser light 0204, in a controllable manner without the need to change the input control which may be a current bias ($I_{bias}$), voltage ($V_{bias}$), or the like 0205 to the semiconductor laser 0201. Additionally the laser may also be input controlled by optical pumping methods. Furthermore both electrical injection and optical pumping can be operated in continuous wave ("CW"), pulsed, synchronous, or asynchronous modes.

The materials of the laser 0201 and tuning material 0203 may be merged using coupling method 0202 in a manner so as to create an intimate contact or transfer layer, thus enabling the mechanical deformation induced in the tuning material 0203 to be physically transferred to the laser 0201. Merging dissimilar materials 0202 may be accomplished by an epitaxial lift-off process, wafer bonding, modified wafer bonding and etching off the substrate, mechanical pressure, gluing, chemical bonding, direct epitaxial growth of laser or equivalent processes or the like. Also the merging of dissimilar materials 0202 is not limited to the process where the laser and tuning material are in intimate contact. A separate coupling layer may be disposed between the tuning material 0203 and the semiconductor laser 0201, and falls within this description for allowing the transfer of the mechanical deformation from the tuning material to the laser. The properties of coupling 0202 can be of very similar or dissimilar materials to the tuning material 0203 and the laser 0201.

The tunable laser assembly 0200 may by applying a bias current ("$I_{BIAS}$") or voltage ("$V_{BIAS}$") 0205 cause the laser to emit light at its designed characteristic or fundamental frequency. A control input like a tuning voltage ("$V_{TUNING}$") 0206 may be applied to the tuning material 0203, thus producing stress-strain that may be transmitted through the coupling layer or interface 0202 to the tunable laser 0201, and causing the wavelength of the light output 0204 to change in some defined manner away from the characteristic wavelength. The tuning voltage ("$V_{TUNING}$") is but one type of control signal that may be used for controlling the tuning material. For example, electrical currents, mechanical controls, magnetic fields and the like may be used in addition to and/or in place of the tuning voltage as input control signals 0206.

Under certain types of stress-strain like compression, the effects of the stress-strain on a QW laser for example may shift the output to shorter wavelengths from the unstrained fundamental or characteristic wavelength; and under certain types of stress-strain like tension, may shift the light emission to longer wavelengths. It may be possible to shift the wavelength under compression to longer wavelengths and a shift the wavelength under tension to shorter wavelengths. An unstrained QW laser can be designed for a given fundamental wavelength such that the introduction of stress-strain produces shifts around the fundamental wavelength. The concept however is not limited to a QW laser and includes other types of semiconductor lasers and devices whose characteristics may similarly be tuned.

Figure 3:
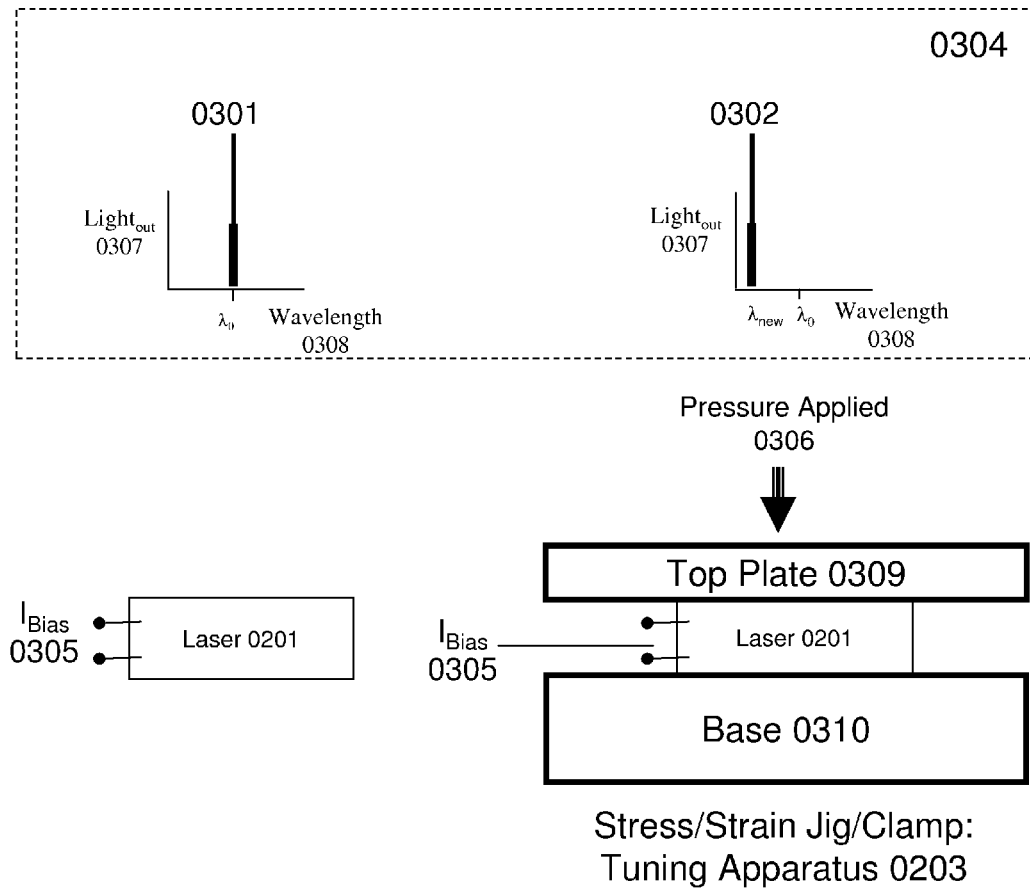
FIG. 3 shows a first example of a tunable laser assembly for mechanically stress-straining a laser to change its output wavelength of light.

FIG. 3 illustrates an example of tunable assembly for mechanically stressing-straining an optoelectronic device, which may include a semiconductor laser. This side view of the figure shows mechanically adjoining a laser to a tuning apparatus and stressing-straining the laser to change output wavelength of laser. Also shown is a depiction of the graphical data representing the change in wavelength 0304. Corresponding to the side views are the above respective graphs 0304 showing how the stress/strain jig tuning apparatus 0203 may affect the laser 0201, but this example is not limited to this configuration. The laser 0201 may be positioned in a stress or strain jig/clamp 0203 on the base 0310 in a loosely or more intimately adjoined method such as with a gluing or bonding process but the application is not limited to such a process. A top plate 0309 is disposed on the top of the laser. The top plate may be loosely coupled or more intimately coupled to the laser 0201. Pressure 0306 can be applied to the strain jig/clamp 0203 at the top plate 0306. The pressure 0306 may include constriction in a vise, application of air pressure, torquing with a screw or micrometer configuration, micro-electro-mechanical, microfluidic or similar ways. This example shows a way of mechanically stressing-straining the laser, but this does not preclude other ways to achieve the same stress-strain on the laser. Typically the laser 0201 may be input controlled by a bias current ($I_{bias}$) 0305, though other signals such as voltage bias, optical pumping and other variations may be used for input control. These signals may be operated in continuous wave (CW), pulsed, synchronous, or asynchronous modes of operation. The laser 0201 with the application of $I_{bias}$ 0305 may output a characteristic wavelength ("$\lambda_0$") 0301, and the light from the laser 0201 may be output from the side of the laser 0201. The dotted box 0304 depicts a possible spectral graphical output of the laser used to characterize the laser, showing a shift in the wavelength of the laser 0201 due to stress-strain. The box 0304 shows the spectral characteristic of the laser 0201, which is usually plotted as $light_{out}$ 0307 (which may be typically power) verses the wavelength 0308. The sharpness of the spectral characteristic is what typically defines a laser 0201. Pressure applied to the laser 0201 can change the output wavelength of the laser 0304 from its fundamental wavelength ("$\lambda_0$") 0301 to a new wavelength ("$\lambda_{new}$") 0302 which has been shifted or tuned away from ("$\lambda_0$") with out changing the ($I_{bias}$) 0305 to the laser 0201 and without substantially changing the sharpness of the spectral characteristic. The manner in which the stress-strain may be applied may determine whether the laser characteristic wavelength will shift to shorter or longer wavelengths. Additionally if the top and bottom of the laser are used for input control of the ($I_{bias}$) 0305 then the top plate 0309 and the base 0310, if they are made of conducting material, may serve as contact points for application of the current bias 0305 to the laser, if it is operated in this manner. Additional monolithic and compact ways of applying pressure to tune the wavelength of the laser, may be applied, such as by using a piezoelectric (or equivalent) material.

Figure 4:
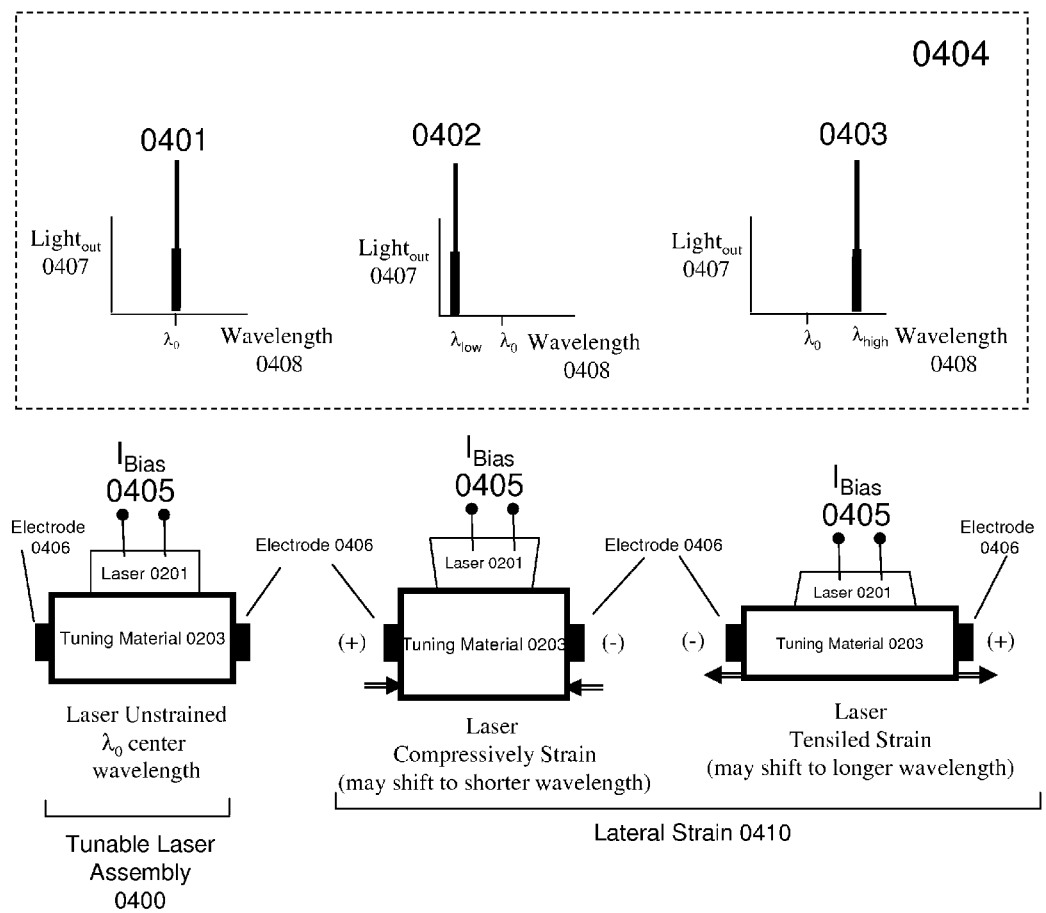
FIG. 4 shows a second example of a tunable laser assembly for electronically stress-straining the laser in the lateral direction.

FIG. 4 shows a side view of an example of a tunable laser assembly 0400 with an applied lateral stress-strain 0410 inducing a change in the output wavelength of the laser and the depicted laser spectral characteristic graphically showing the change in light output of the laser 0404. The side view drawings of the different laser stress-strain configurations correspond to the above graphical depictions of the corresponding light output graphs 0404.

In this example a semiconductor laser 0201 is coupled, typically by direct attachment or by equivalent ways, to a tuning material 0203 such as an exemplary piezoelectric, by wafer bonding, gluing, or by utilizing an intermediary adhesive material such as gold metal in the wafer bonding process, but may not be limited by these techniques.

The adjoining method of disposing the laser on to the piezoelectric may utilize equipment such as a wafer bonder, which may take the laser 0201 and the tuning material 0203 and fuse the two materials under heat, pressure, ultrasound to form a monolithic unit. Due to the typical formation of a strong bond between the laser 0201 and the tuning material 0203, it is possible to directly transfer stress-strain from the tuning material 0203 to the laser 0201. Additionally it may be possible to use an adhesion layer like a glue or a metal which may form an intermediary bond between the laser 0201 and the tuning material 0203 thus also forming a monolithic unit where the stress-strain can be transferred directly to the laser 0201.

Typically the laser 0201 may be input controlled by a bias current ($I_{bias}$) 0405, though other techniques such as voltage bias, optical pumping and other variations may be used for input control. These techniques may be operated in continuous wave (CW), pulsed, synchronous, or asynchronous modes of operation. The laser 0201 under ($I_{bias}$) 0405 may output a characteristic wavelength ("$\lambda_0$") 0401. In this example the laser light may occur from the side of the laser or the top of the laser. The dotted box 0404 depicts a possible spectral graphical output of the laser by standard measurement techniques used to characterize the laser, showing a shift in the wavelength of the laser due to stress-strain. The box 0404 shows the spectral characteristic of the laser, which is usually plotted as $light_{out}$ 0407 (which may typically be power) verses the wavelength 0408. The sharpness of the spectral characteristic is what typically defines a laser.

The tuning material (or device or apparatus) 0203 produces mechanical deformation that may be directly transmitted to the tunable material or device 0201. The tuning material 0203 may be for example any material, device or assembly capable of producing a mechanical deformation, for example a strain actuator such as a piezoelectric material, or its equivalent may be used. The input control to the tuning material may be a voltage, current, magnetic field, mechanical pressure, or any input control that allows for the control of the tuning material. The tuning material 0203, is capable of deformation by the application of an input control which may be a voltage bias at electrodes 0406 which may be on the sides of the tuning material. The tuning material 0203 may deform in the lateral direction depending on the application of voltage to the electrodes 0406, in compression or in tension. The arrows in the figure show examples of possible directions of deformation for compression and tensile strain. The arrows in the figure for lateral compressively and tensiled stress-strain show one of many possible directions of deformation.

The laser 0201 may be biased ($I_{bias}$) 0405 to produce a characteristic wavelength when the laser 0201 is unstrained, shown graphically in light output 0404 with the emitted output wavelength is typically a characteristic or fundamental wavelength ("$\lambda_0$") 0401. When a voltage is applied to the tuning material 0203 through the electrodes 0406, such that the tuning material undergoes lateral compressive stress-strain, because the laser 0201 is adjoined to the tuning material, the stress-strain will be transferred from the tuning material 0203 to the laser 0201. The laser output 0404 may blue shift to shorter wavelengths, such as ($\lambda_{low}$) 0402. Conversely, when a suitable voltage is applied to the tuning material 0203 through the electrodes 0406 such that the tuning material undergoes lateral tensile stress-strain, the laser output 0404 may red shift to longer wavelengths, such as ($\lambda_{high}$) 0403. It may be possible that the sequence of the application of lateral strain to the laser may be different then described. The above example describes a way of tuning by applying forces in a single direction. However tuning may also be accomplished by applying forces in several directions at once, such as by bending, twisting or the like.

Figure 5:
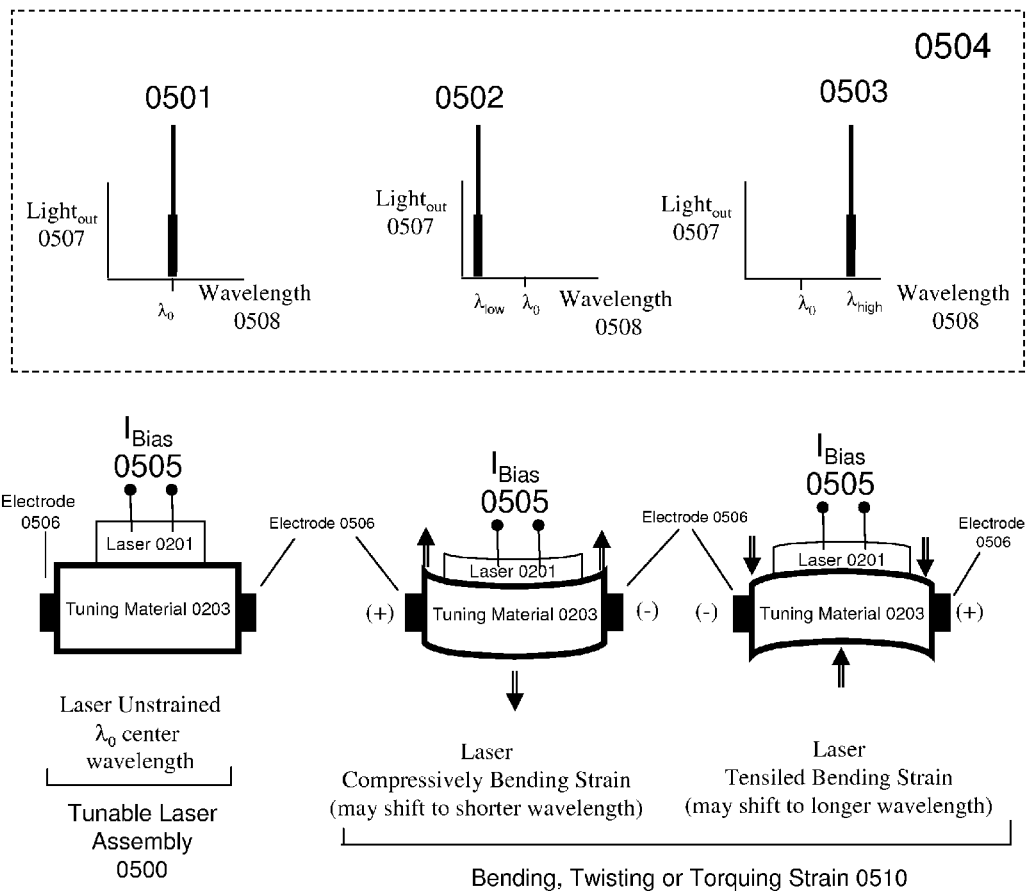
FIG. 5 shows a third example of a tunable laser assembly for electronically stress-straining the laser in a bending, twisting or torquing manner.

FIG. 5 shows a side view of an example of a tunable laser assembly 0500 with an applied bending, twisting or torquing stress-strain 0510, as inducing a change in the output wavelength of the laser and the depicted laser spectral characteristic graphically showing the change in light output of the laser 0504. The side view drawing of the different laser operations correspond to the above graphical depictions of the corresponding light out put 0504. In this example a semiconductor laser 0201 may be coupled, typically by direct attachment, to a tuning material 0203 (such as an exemplary piezoelectric), by wafer bonding, gluing, or by utilizing an intermediary adhesive material such as gold metal in the wafer bonding process, but may not be limited to these techniques.

The adjoining method of disposing the laser on to the piezoelectric may utilize equipment such as a wafer bonder, which may take the laser 0201 and the tuning material 0203 and fuse the two materials under heat and pressure to form a monolithic unit. Due to the formation of a strong bond between the laser 0201 and the tuning material 0203, it may be possible to directly transfer strain from the tuning material 0203 to the laser 0201. Additionally it may be possible to use an adhesion layer like a glue (or a metal) which may form an intermediary bond between the laser 0201 and the tuning material 0203, thus also tending to form a monolithic unit where the strain can be transferred directly to the laser 0201.

Typically the laser 0201 may be input controlled by a bias current ($I_{bias}$) 0505, though other methods such as voltage bias, optical pumping and other variations may be used for input control. These methods may be operated in continuous wave (CW), pulsed, synchronous, or asynchronous modes of operation. The laser 0201 under ($I_{bias}$) 0505 may output a characteristic wavelength ("$\lambda_0$") 0501. In this example the laser light may be emitted from the side of the laser or the top of the laser. The dotted box 0504 depicts a possible spectral graphical output of the laser (measured by standard measurement techniques) used to characterize the laser, showing a shift in the wavelength of the laser due to stress-strain. The box 0504 shows the spectral characteristic of the laser, which is usually plotted as light$_{out}$ 0507 (which may typically be power) verses the wavelength 0508. The sharpness of the spectral characteristic is what typically defines a laser.

The tuning material (or device or apparatus) 0203 produces mechanical deformation that may be directly transmitted to the tunable material or device 0201. The tuning material 0203 may be for example any material, device or assembly capable of producing a mechanical deformation. For example a strain actuator such as a piezoelectric material, or its equivalent may be used. The input control to the tuning material may be a voltage, current, magnetic field, mechanical pressure, or any input control that allows for the control of the tuning material. The tuning material 0203, is capable of deformation by the application of an input control which may be a voltage bias at electrodes 0406 which may be on the sides of the tuning material. The tuning material 0203 may deform in the vertical, bending, twisting or torquing direction depending on the application of voltage to the electrodes 0506, in compression or in tension. The arrows in the figure for compressively and tensiled bending strain show one of many possible directions of deformation.

The laser 0201 may be biased ($I_{bias}$) 0505 to produce a characteristic wavelength when the laser 0201 is unstrained, shown graphically in light output 0504 with the emitted output wavelength typically at a characteristic or fundamental wavelength ("$\lambda_0$") 0501. When a voltage is applied to the tuning material 0203 through the electrodes 0506, such that the tuning material undergoes compressively bending stress-strain, because the laser 0201 is adjoined to the tuning material 0203, the stress-strain will be transferred from the tuning material 0203 to the laser 0201. The laser or light output 0504 may blue shift to shorter wavelengths, such as ($\lambda_{low}$) 0502. Conversely, when a suitable voltage is applied to the tuning material 0203 through the electrodes 0406 such that the tuning material undergoes tensile bending stress-strain, the laser or light output 0504 may red shift to longer wavelengths, such as ($\lambda_{high}$) 0503. It may be possible that the sequence of the application of bending, twisting and torquing stress-strain 0510 to the laser may be different then described. The electronic tuning of a laser described above may also be applied in combination with a compact mechanical fixture to tune the laser.

Figure 6A:
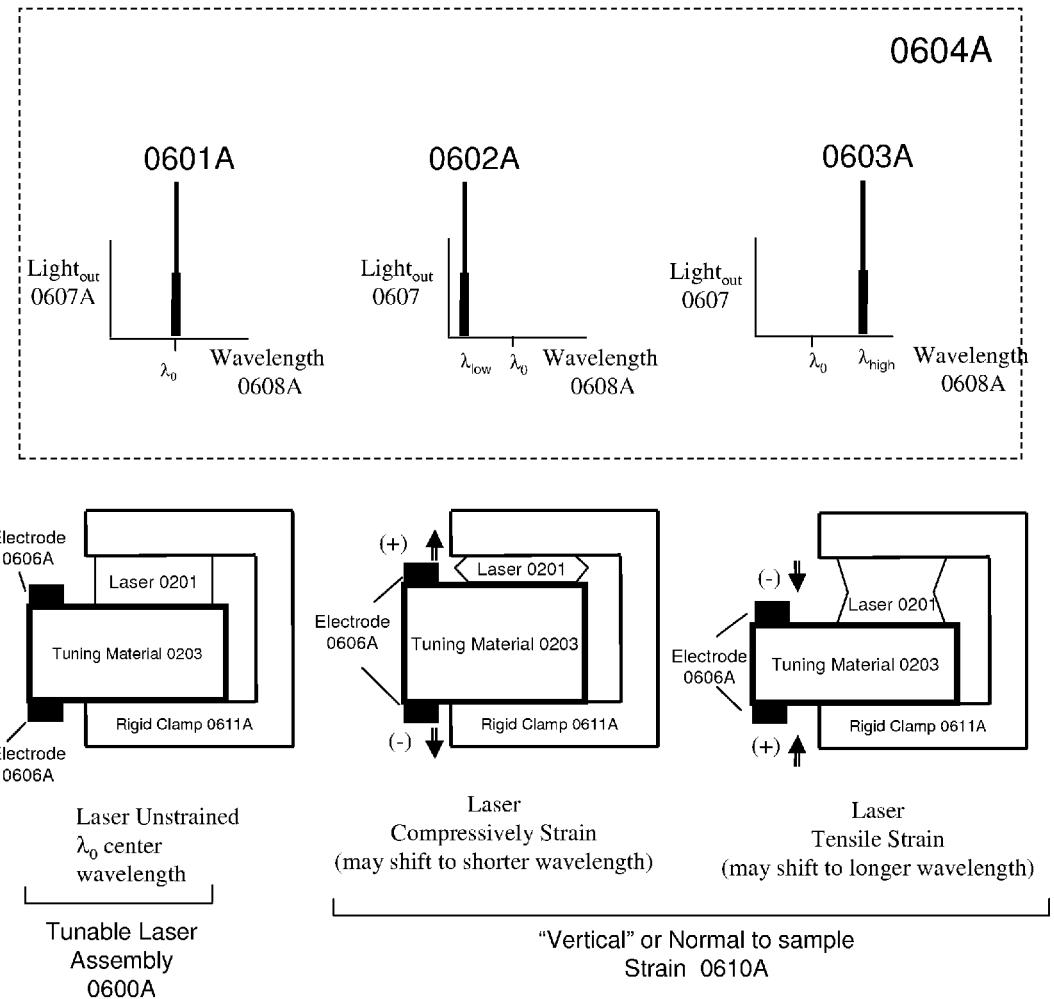
FIG. 6A shows a fourth example of a tunable laser assembly for mechanically and electronically stress-straining the laser using a tuning material and clamp.

FIG. 6A shows a side view of an example of a tunable laser assembly 0600A with the ability to increase the applied vertical strain 0610A to the laser 0201, by employing a rigid clamp 0611A and a tuning material 0203 such that the laser 0201 can be stressed-strained in the "vertical" direction 0610A inducing a change in the output wavelength of the laser and the depicted laser spectral characteristic graphically showing the change in light output of the laser 0604A. It should be noted that "vertical" or "lateral" is only used in relationship to the drawing and is not meant as an absolute direction, but more to contrast to the other examples described. It should be noted that because one can arbitrarily orient the tunable laser assembly in any direction, typical directional signatures are used only for illustration and not for purposes of any absolute direction. The side view drawings of the different laser stress-strain operations correspond to the above graphical depictions of the corresponding light out put 0604A. In this example a semiconductor laser 0201 is coupled, typically by direct attachment, to a tuning material 0203 such as an exemplary piezoelectric, by wafer bonding, gluing, or by utilizing an intermediary adhesive material such as gold metal in the wafer bonding process, but tunable laser assembly 0600A is not limited by these techniques. The top of the laser 0201 may also be directly adjoined to the rigid clamp 0611A by various described attachment methods.

Typically the laser 0201 may be input controlled by a bias current, voltage bias, optical pumping and other variations. For simplicity the input control to the laser 0201 is not shown, but it is typically understood that the laser normal mode of operation includes input control methods as described. It should be noted that if one uses optical pumping as a method of input controlling the laser 0201, this may eliminate the need for electrical contact pads to laser 0201, because this generally entails using an "additional laser" to optically pump the laser 0201. The input control techniques may be operated in continuous wave (CW), pulsed, synchronous, or asynchronous modes of operation. The laser 0201 in an unstrained state may output a characteristic wavelength ("$\lambda_0$") 0601A. In this example the laser light may be emitted from the side of the laser. The dotted box 0604A depicts a possible spectral graphical output of the laser by standard measurement used to characterize the laser, showing a shift in the wavelength of the laser due to stress-strain. The box 0604A shows the spectral characteristic of the laser, which is usually plotted as light$_{out}$ 0607A (which may typically be power) verses the wavelength 0608A. The sharpness of the spectral characteristic is what typically defines a laser.

When a voltage is applied to the tuning material 0203 through the electrodes 0606A, such that the tuning material undergoes compressive stress-strain, the laser or light output 0604A may blue shift to shorter wavelengths, such as ($\lambda_{low}$) 0602A. Conversely, when a suitable voltage is applied to the tuning material 0203 through the electrodes 0606A such that the tuning material undergoes vertical tensile stress-strain, the light output 0604A may red shift to longer wavelengths, such as ($\lambda_{high}$) 0603A. The arrows in the figure show the direction of deformation of the tuning material 0203. It may be possible that the sequence of the application of strain to the laser may be different then described. The rigid clamp 0606A allows for further increases in strain to the laser. The "C" rigid clamp 0611A structure allows force to be transmitted from one side of the laser to the other, as the tuning material 0203 which may be a piezoelectric material, operates.

It is typically noted that any variation of stress and/or strain applied by a tuning material 0203 to tunable material 0201 by the described stresses or additional variations as torquing stresses-strains or pinpoint stresses-strains may be also possible. Pinpoint stresses-strains could be accomplished by having a pointed or rounded end physically in contact with the surface of the laser. Because the stress-strain can be increased dramatically for such small area contacts, this offers an additional example of a way to form a tunable laser or device assembly.

Figure 6B:
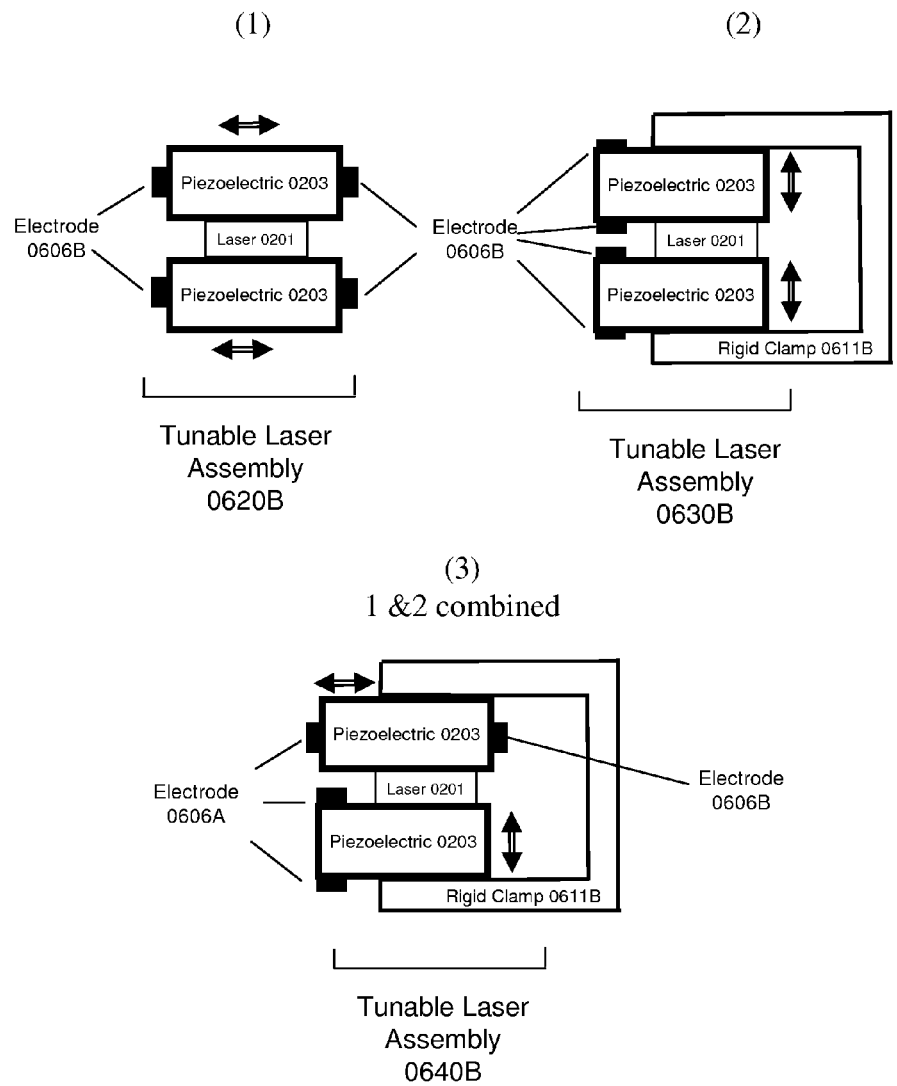
FIG. 6B shows three additional examples of a tunable laser assembly employing two piezoelectrics for enhanced stress-strain effects.

FIG. 6B shows side views of additional variations for enhancing stress-strain effects on the laser 0201 to further shift the laser wavelength from its characteristic wavelength in the unstrained-unstressed state. For simplicity the input control to the laser 0201 is not shown, but it is typically understood that the normal mode of operation of the laser includes input control. Typically in these geometries the laser light may be emitted from the side of the laser. The variations shown may incorporate two piezoelectrics 0203 to provide additional stress-strain and control. Each piezoelectric 0203 may be independently controlled for straining the laser 0201, in a variety of manners. This figure shows methods of increasing the stress-strain by utilizing two piezoelectrics for increasing the wavelength tunable range of the laser 0201. Variation (1) utilizes two piezoelectrics. Variation (2) uses two piezoelectrics and a clamp. Variation (3) is a combination of (1) and (2). All three examples allow for enhanced wavelength tunability control of the laser. These variations include either intimate bonding and/or mechanical coupling for the formation of the tunable laser.

Variation (1) shows a tunable laser assembly 0620B for the case that laser 0201 may be coupled via a bonding, gluing, or using an intermediary adhesive material like gold to the two piezoelectrics. The bottom of the laser 0201 is coupled to the top of a first piezoelectric 0203, and the top of the laser 0201 is coupled to the bottom of a second piezoelectric 0203. Once the laser 0201 is joined to two piezoelectrics 0203, independent control of the piezoelectrics 0203 allows for additional sensitive control for lateral stress-strain induction into the laser 0201. The arrows show the direction of deformation of the piezoelectrics. The top piezoelectric 0203 can be controlled first, and then the bottom piezoelectric 0203 can be turned on. Thus the degree of strain can be doubled with twice the control. Also the piezoelectrics 0203 can be operated in opposition. Though the example shows a piezoelectric other variations of tuning materials may be used in a similar fashion.

Variation (2) shows a tunable laser assembly 0630B for the case that laser 0201 may be coupled via a bonding, gluing, intermediary adhesive material like gold technique to the two piezoelectrics 0203 as in variation (1), but the stress-strain from the piezoelectrics is the applied to the sample in the vertical direction as shown by the arrows. This type of geometry may utilize a "C" rigid clamp 0611B to maximize the stress-strain on the laser 0201. Once the laser 0201 is joined to two piezoelectrics 0203, independent control of the piezoelectrics allows for additional sensitive control for "vertical" or normal to the laser stress-strain induction into the laser 0201. The top piezoelectric 0203 may be controlled by applying the appropriate input control voltage to electrodes 0606B, and similarly the bottom piezoelectric 0203 can be activated in this fashion, thus the degree of stress-strain can be doubled with twice the control. The arrows show the deformation of the piezoelectric 0203. Also the piezoelectrics 0203 can be operated in opposition, yielding very precise control of the stress-strain to the laser 0201.

Variation (3) shows a tunable laser assembly 0640B for the case that laser 0201 may be coupled via a bonding, gluing, intermediary adhesive material like gold technique to the two piezoelectrics 0203. Additionally the assembly is placed in a rigid clamp 0611B which allows for maximizing lateral and "vertical" strain to the laser as shown by the arrows showing the possible deformations to the piezoelectrics 0203.

This configuration may be considered a combination of variation (1) and (2), because the top piezoelectric places lateral stress-strain on the laser 0201 and the bottom piezoelectric 0203 places vertical stress-strain on the laser. Once the laser 0201 is joined to two piezoelectrics 0203, independent control of the two piezoelectrics 0203 allows for additional sensitive control for lateral and vertical strain induction into the laser 0201. The top piezoelectric 0203 may be controlled first, and then the bottom piezoelectric 0203 can be turned on by applying an appropriate input control voltage to the electrodes 0606B, thus the degree of strain may be doubled with twice the control. The arrows show the direction of deformation of the piezoelectric 0203. Also the piezoelectrics 0203 may be operated in opposition, yielding very precise control of the stress-strain to the laser 0201. These are some variations that can be utilized for making a more versatile tunable laser system, however other variations may be possible. In addition to applying mechanical force in a single direction, in several directions by twisting, by adding a clamp like structure, or by utilizing the clamp structure and one or more piezoelectric materials other devices that produce mechanical forces may be included.

Figure 6C:
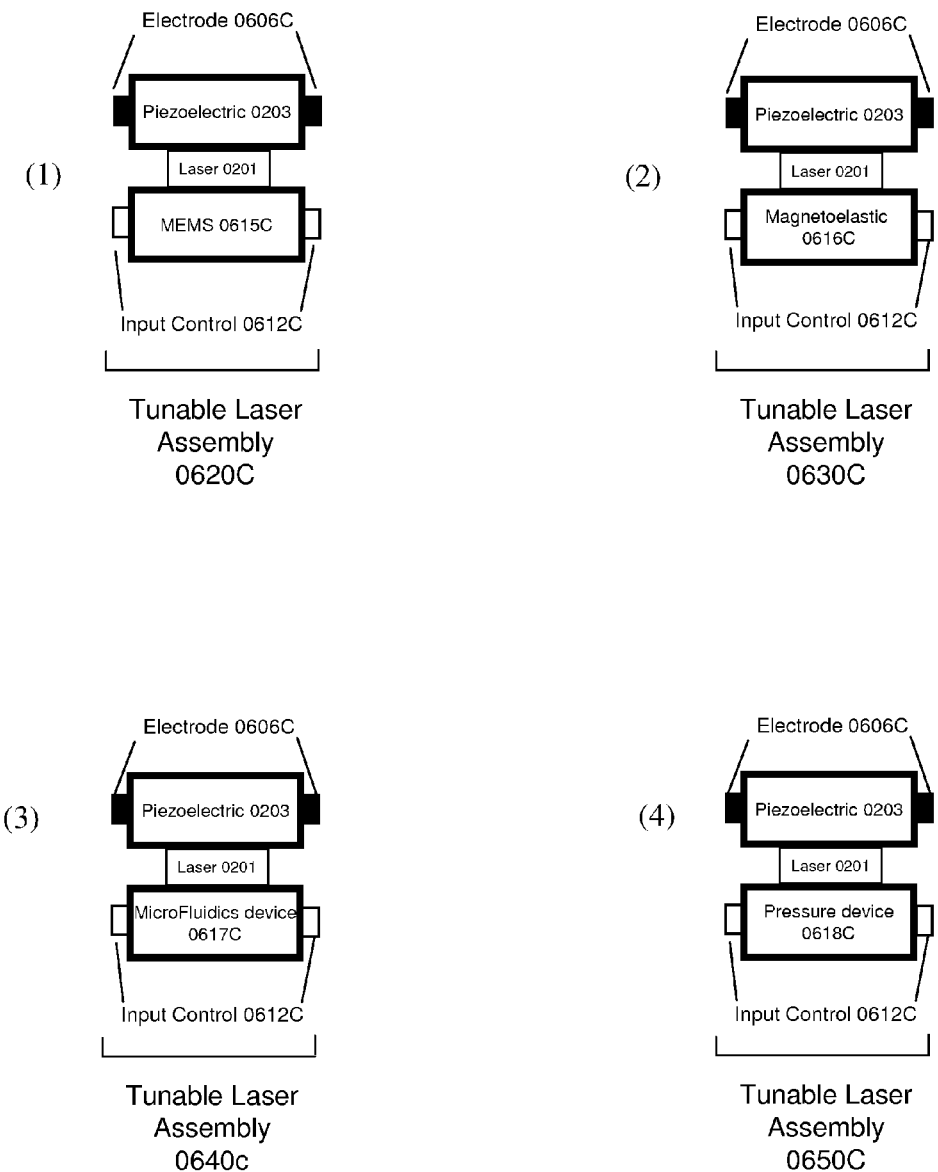
FIG. 6C shows four additional examples of a tunable laser assembly employing a piezoelectric in combination with a MEMS, magneto-elastic, micro-fluidics or pressure producing device.

FIG. 6C shows additional variations for enhancing stress-strain effects on the laser 0201 to further shift the laser wavelength from the unstrained characteristic wavelength of the laser. For simplicity the input control to the laser 0201 is not shown, but it is typically understood that the laser in normal operation typically includes input control. Typically the laser light may be emitted from the side of the laser. The variations shown may incorporate a piezoelectric 0203 with another method of producing stress-strain in the laser, which may result in additional strain and control. Each piezoelectric 0203 and the second technique of straining can be independently controlled for straining the laser 0201.

Variation (1) shows a tunable laser assembly 0620C for the case that laser 0201 is coupled via a bonding, gluing, intermediary adhesive material like gold technique to the piezoelectric 0203 and additionally coupled to a MEMS device 0615C. The MEMS device 0615C may apply stress-strain to laser 0201 via a pointed pressure mechanism which may utilize an input control 0612C by a voltage. Once the laser 0201 is joined to two stress-strain devices, independent control of the piezoelectric 0203 and the MEMS device 0615C allows for additional sensitive control for lateral stress-strain induction into the laser 0201. The piezoelectric 0203 can be controlled independent of the MEMS device 0615C thus the degree of stress-strain may be doubled with twice the input control to produce varying degrees of stress-strain.

Variation (2) shows a tunable laser assembly 0630C for the case that laser 0201 is coupled via a bonding, gluing, intermediary adhesive material like gold technique to the piezoelectric 0203 and additionally coupled to a magnetoelastic device 0616C. The magnetoelastic device 0616C may apply stress-strain to laser 0201 via a bending, twisting or torquing mechanism which may utilize an input control 0612C of a magnetic field. Once the laser 0201 is joined to two stress-strain devices, independent control of the piezoelectric 0203 and the magneto-elastic device 0608C allows for additional sensitive control for stress-strain application to the laser 0201.

Variation (3) shows a tunable laser assembly 0640C for the case that laser 0201 is coupled via a bonding, gluing, intermediary adhesive material like gold technique to the piezoelectric 0203 and additionally coupled to a microfluidics device 0617C. The microfluidics device 0617C may apply stress-strain to laser 0201 via a bending, twisting or torquing mechanism which may require an input control 0612C of a pressure. Once the laser 0201 is joined to two stress-strain devices, independent control of the piezoelectric 0203 and the microfluidics device 0617C allows for additional sensitive control for stress-strain application to the laser 0201. The microfluidics device 0617C allows for the possibility of slowly building up the pressure on the laser 0201 and thus may be minimizing damage to the laser 0201.

Variation (4) shows a tunable laser assembly 0650C the case that laser 0201 is coupled via a bonding, gluing, intermediary adhesive material like gold technique to the piezoelectric 0203 and additionally coupled to a pressure producing device 0618C. The pressure producing device 0618C may apply stress to laser 0201 via a hydrostatic, mechanical, or of like mechanism which utilizes an input control 0612C by a voltage, current, mechanical, or like techniques. Once the laser 0201 is joined to two stress-strain devices, independent control of the piezoelectric 0203 and the pressure producing device 0618C allows for additional sensitive control for lateral strain induction into the laser 0201. These are some variations that can be utilized for making a more versatile tunable laser system, but the disclosure is not limited to these variations.

Figure 7:
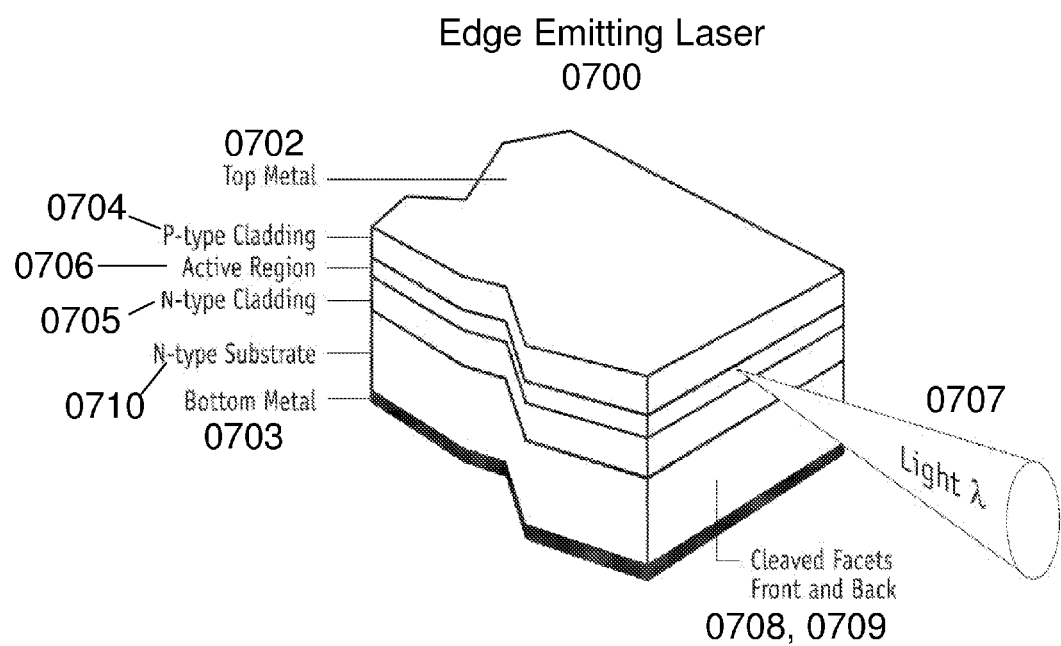
FIG. 7 shows a perspective view of an example of a semiconductor edge emitting laser for use in the tunable laser assembly.

FIG. 7 is a perspective schematic of a typical edge emitting or in-plane semiconductor laser 0700. The edge emitting laser 0700 may consist of a substrate 0710 with an active region 0706 disposed between a p-type layer 0704 and an n-type layer 0705. Cleaved facets on the front 0708 and on the back 0709 of the laser typically form a resonant optical cavity. The order if the layers may not be restricted as described above. To activate the laser, a bias current can be applied to top 0702 and bottom 0703 metal contacts. Upon application of the bias to the laser, light of a wavelength λ is typically emitted 0707 from the edge of the laser.

An exemplary edge emitting semiconductor laser may include an indium gallium arsenic phosphide (InGaAsP) quantum well active region material 0706 on an indium phosphide (InP) substrate 0710 for near-infrared (IR) light emission 0707, or their equivalents. The QW active region of the structure is typically capable of emitting a designed center wavelength over a wide range of possible wavelengths depending on a number of device design parameters including but not limited to the thickness and composition of the layer materials. Being able to tune light over the wide range of wavelengths could be useful for a variety of applications.

The design and fabrication of this type of edge emitting laser structure may utilize consideration of the material properties of each layer within the structure, including energy band structure and band alignments, electronic transport properties, optical properties, systems design, and the like. An edge emitting laser such as the exemplary one described above may satisfactorily be wavelength tuned in the manner previously described.

It may also be possible to omit the top metal 0702 and the bottom metal 0703 and optically pump the edge emitter 0700 from the top, bottom or side with another laser that may have an emission wavelength shorter than the edge emitter 0700. This may simplify the process since metallization of the laser 0700 can be avoided.

Figure 8:
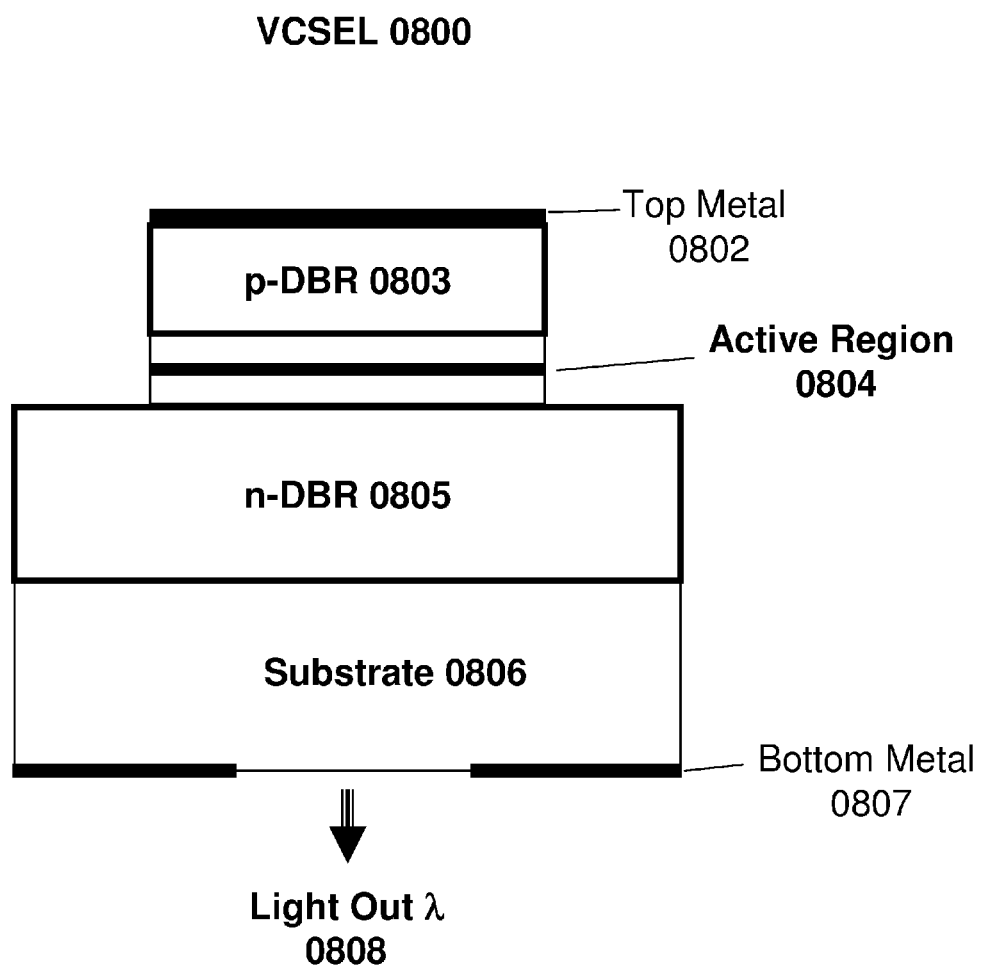
FIG. 8 shows a side view of an example of the vertical cavity surface emitting laser for use in the tunable laser assembly.

FIG. 8 is a schematic of the side view of a vertical cavity surface emitting laser ("VCSEL") 0800. A substrate 0806 may have deposited layers of p-type distributed Bragg reflectors ("DBR") material 0803, and n-type distributed Bragg reflector material 0805. An active region 0804 is inserted between the DBR structures 0803, 0805. Metal contacts 0802, 0807 are provided for applying a bias to the laser. The p-type DBRs 0803 and n-type DBRs 0805 form the resonant optical cavity. The order of the layers is not restricted as described above. Upon application of a current bias to the laser, light is typically emitted 0808 from the surface of the laser. A VCSEL laser 0800 such as the exemplary one described above may satisfactorily be tuned in the manner previously described, with provision made to allow laser emission from the top of the structure rather than from the side, or edge, as in the edge emitting laser of FIG. 7.

It may also be possible to omit the top metal 0802 and the bottom metal 0807 and optically pump the VCSEL 0800 from the top or bottom with another laser that may have an emission wavelength shorter than the VCSEL 0800. This may simplify the process since metallization of the laser 0700 can be avoided.

For both the edge emitting laser 0700 and the VCSEL 0800 the input control to the lasers may be a current bias, voltage bias or optical pump techniques as described. Furthermore both electrical injection and optical pumping can be operated in continuous wave (CW), pulsed, synchronous, or asynchronous modes of operation. Next details on tuning apparatuses that may employ a clamping type of device will be shown.

Figure 9:
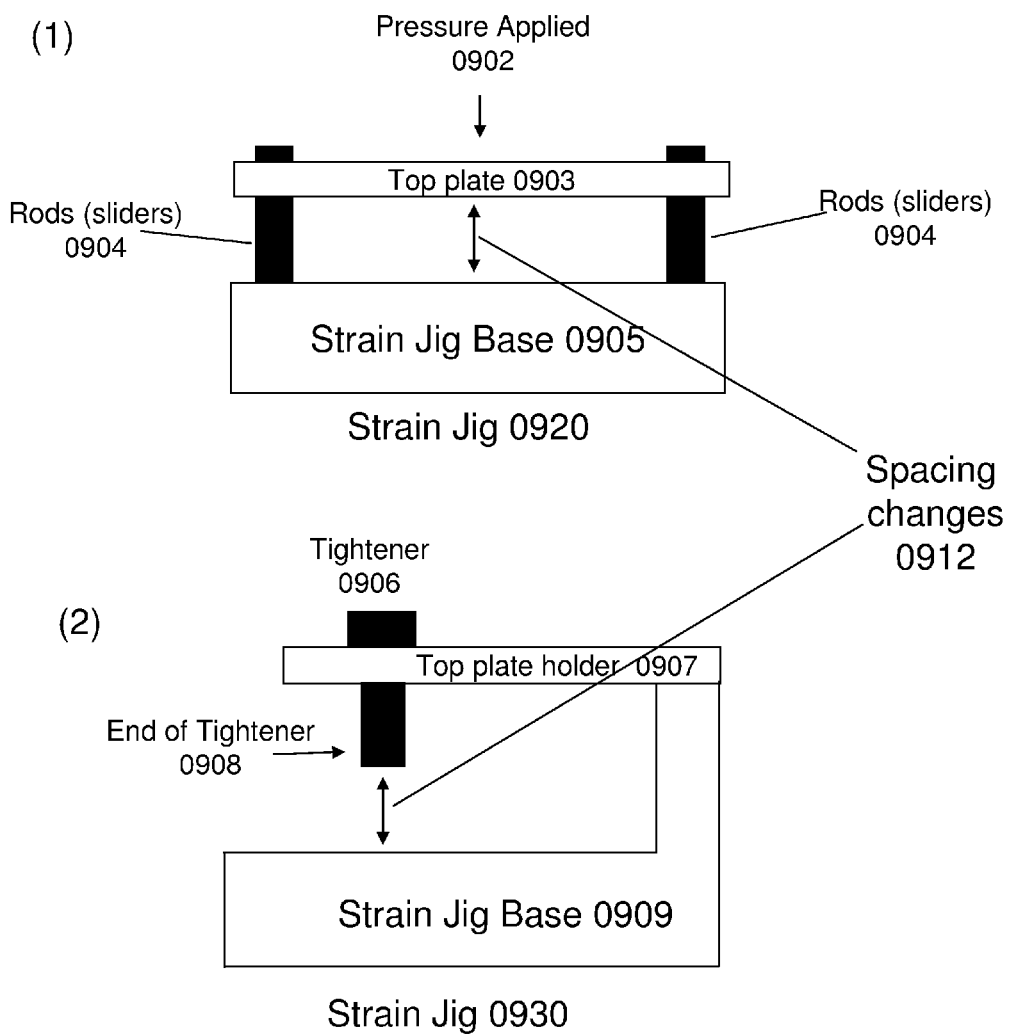
FIG. 9 shows two examples of the tuning apparatus of the tunable device assembly for applying stress-strain mechanically.

FIG. 9 shows a side view of two variations of a stress-strain jig 0920 and 0930 that may act as a tuning apparatus for stressing-straining a laser. Variation (1) acts as a stress-strain jig 0920 with applied pressure at 0902 to strain the material in the space 0912. The strain jig may employ air, hydraulic, and/or mechanical pressure at point or region 0902 to physically strain the device by forcing top plate 0903 towards strain jig base 0905. The rods 0904 act as sliders so that top plate 0903 can move down in a controllable manner.

Variation (2) of the stress-strain jig 0930 acts as a stress-strain jig with a tightener 0906 which may be a torquing screw or micrometer assembly or the like, to stress-strain the material in the space 0912. The stress-strain jig may use a tightener 0906 which may or may not be threaded through top plate holder 0907 to physically stress-strain the device by forcing the flat end of tightener 0908 towards base 0909. The end of the tightener 0908 may be flat, rounded or pointed or any other variation to produce a stress-strain force to material in the space 0912. Two variations among many other possibilities are shown in this figure.

It may be possible to employ a MEMS type device like variation 0930 for stressing-straining of the laser. The MEMS device may control a pointed tip that may cause a high level of stress-strain if applied to the laser. Next further details of the exemplary tuning material that may be used in combination with the above described exemplary lasers and exemplary mechanical fixtures are provided.

Figure 10A:
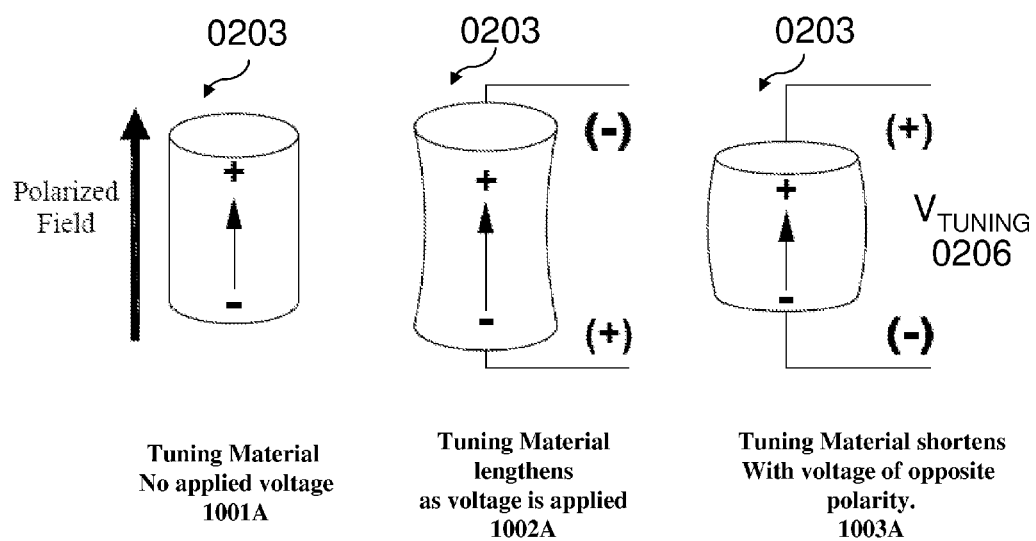
FIG. 10A shows tuning material properties and some of the characteristics of tuning material deformation upon application of a voltage.

FIG. 10A shows tuning material properties 1000A and some of the deformation characteristics of tuning material 0203 upon application of a voltage $V_{tuning}$ 0206. An exemplary tuning material may be made from ceramic having piezoelectric properties which would have a built in polarized field 1001A in the normal state. The tuning material 0203 may be capable of being deformed by either lengthening 1002A or shortening 1003A dependent on the polarity of the voltage applied to the tuning material, and it may be capable of fine deformations usually in the angstrom range. A typical configuration is to build the tuning material into a chip-capacitor like structure, having layers of piezoelectric material, interdigitated electrodes, and terminations coupled to the electrodes. Other tuning material types may be used in different examples such, as other types of devices including MEMs, magneto-elastic, microfluidic and the like.

Figure 10B:
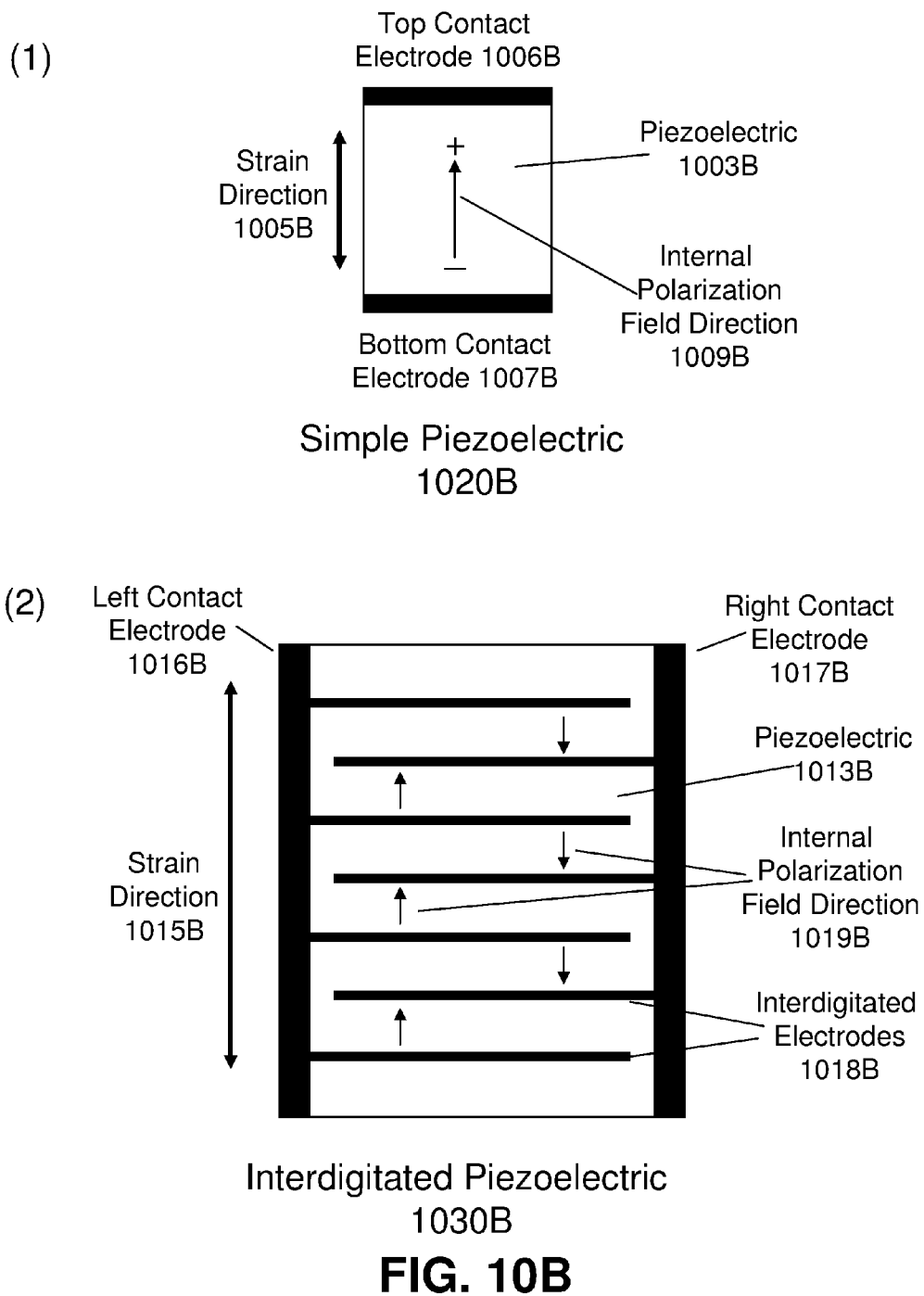
FIG. 10B is a side cross-sectional views of two typical configurations of tuning material made from a piezoelectric material.

FIG. 10B shows side cut away views of two typical configurations of the tuning material 0203 (of FIG. 10A) made from a piezoelectric material. Example (1) shows a simple piezoelectric 1020B that consists of a piezoelectric material 1003B sandwiched by top contact electrode 1006B and a bottom contact electrode 1007B. The piezoelectric generally has an internal polarization field direction 1009B denoted by the arrow, and with the (+) and (−) sign showing the polarity. A voltage is typically applied to the contact electrodes 1006B and 1007B and depending on the polarity of the voltage will determine the elongation or shrinkage of the piezoelectric 1003B. The stress-strain direction 1005B for the simple piezoelectric 1020B is shown by the double headed arrow. In the simple piezoelectric 1020B the strain direction 1005B is in line with the top and bottom contact electrodes 1006B and 1007B.

Example (2) is a sideway cut away view of the interdigitated piezoelectric 1030B. This structure consists of a left contact electrode 1016B and a right contact electrode 1017B with a piezoelectric material 1013B sandwiched between the contacts with interdigitated electrodes 1018B. The interdigitated electrodes separate alternating polarity piezoelectrics dictated by the internal polarization field direction 1019B as shown by the arrows. This structure forms a multilayer sandwich of to maximize the strain in the structure. A voltage is typically applied to the electrode contacts 1016B and 1017B which are at the ends of the structure and depending on the polarity of the voltage will determine the elongation or shrinkage of the piezoelectric 1006B. The strain direction 1015B is shown by the double headed arrow. In the interdigitated piezoelectric 1030B the strain direction 1015B is typically perpendicular to the line between electrode contacts 1016B and 1017B. This allows contact electrodes 1016B and 1017B to be placed out of the way of the direction of elongation or shrinkage of the interdigitated piezoelectric 1030B, which is in contrast to the simple piezoelectric 1020B. It should be noted that "top", "bottom", "left" or "right" is only used in relationship to the drawing and is not meant as an absolute direction, but more to contrast to the other examples described.

Piezoelectric materials may be considered unique in that the application of a voltage to these structures creates an electric field polarization, thereby distorting the crystal to lengthen or contract depending on the polarity of the voltage. The piezoelectric elements are versatile in that they may be capable of attaining large stress-strains, and are often optimized for large stresses-strains with typical voltages up to around 100 V. Piezoelectric actuators are typically superb for minute incremental application of stresses-strains to materials because the movement of the actuator can be on the order of 1 angstroms (Å). A piezoelectric actuator can produce extremely fine position changes down to the sub-nanometer range. The smallest changes in operating voltage can be converted into smooth movements. Motion is typically not influenced by stiction, friction or threshold voltages. Piezoelectrics may be used as tuning material 0203 in the previously discussed examples. Single crystal plates, disks, and rings, are available and may equivalently be utilized as tuning materials 0203. Typical finished crystal sizes range 1 to 15 millimeters (mm) laterally and 0.1 to 2 mm in thickness, but can be designed to almost any dimensions. These are typically adequate geometries to attach to laser chips.

Next the coupling of the exemplary tuning materials to the exemplary lasers will be described.

Figure 11:
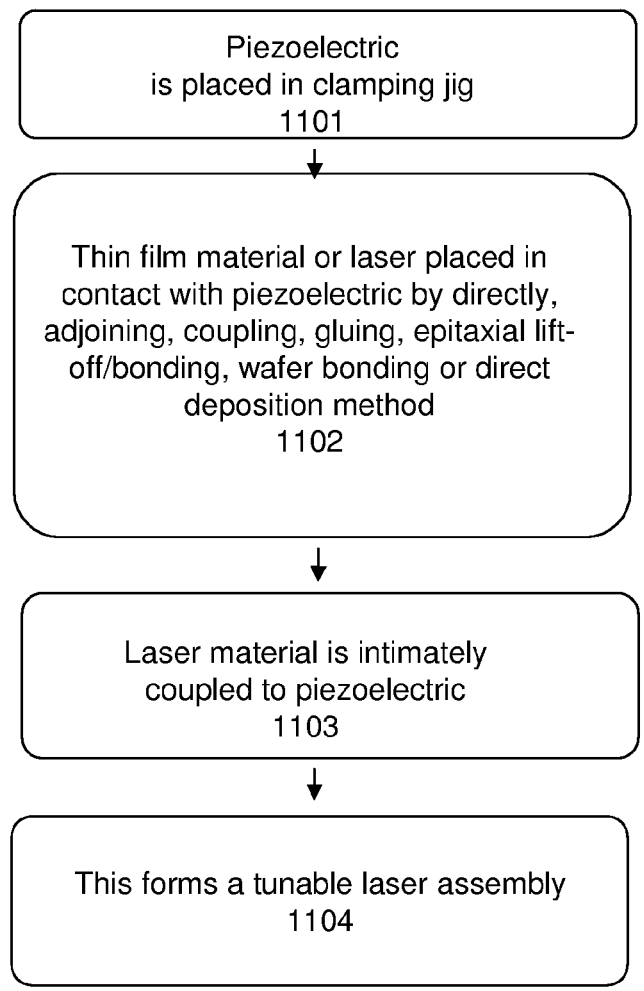
FIG. 11 shows a flow chart of a method of combining the tuning material with the laser or other tunable material within a mechanical jig that allows for deformation of a tunable laser or other tunable device.

FIG. 11 is a flow chart of an adjoining or coupling method where the piezoelectric is placed in a clamping jig 1101 and then the tunable material or laser is coupled by direct contact or by an intermediary and then clamped together in the jig 1102. The intermediary can consist of an adhesive such as a glue or metal or any variation that allows for attachment of the laser to the tuning material, the piezoelectric in this case, and it also include processes or methods to make the intermediary coupled tunable material to the tuning material effectively. The laser is then intimately coupled to the piezoelectric 1103, and the piezoelectric can by the application of an input control signal, typically a voltage, directly stress-strain the laser to cause a change in the wavelength of the emitted light from its characteristic or unstrained state. The entire structure forms a tunable laser assembly 1104. The tunable laser assembly 0600A of FIG. 6A shows a possible diagram for final structure 1104.

Figure 12:
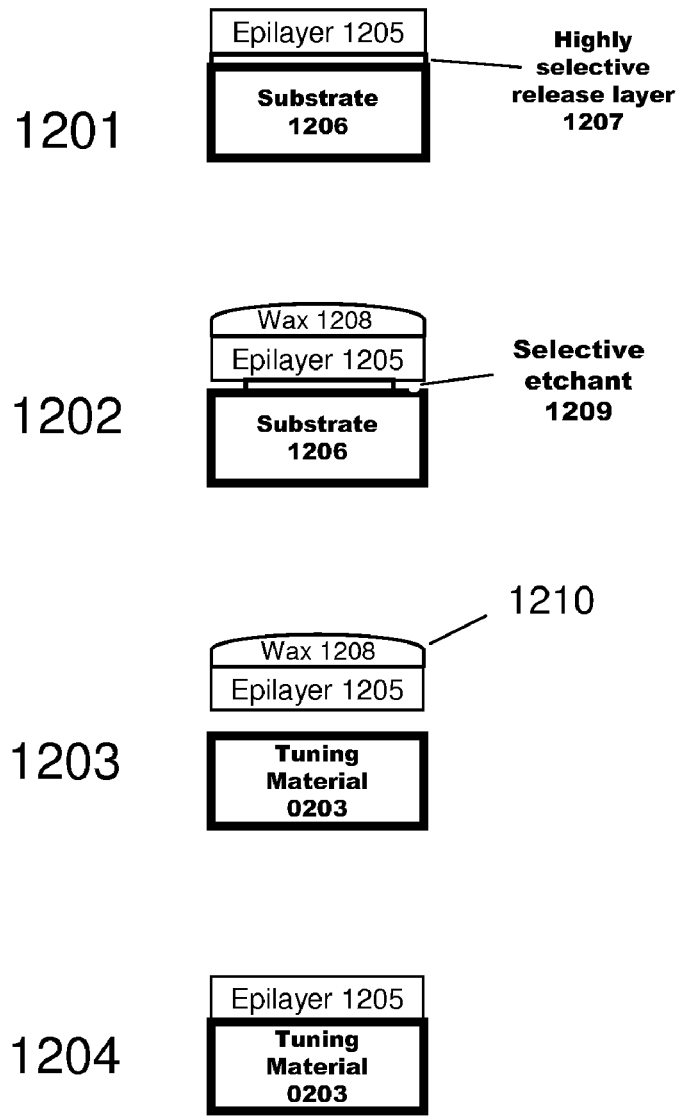
FIG. 12 illustrates an exemplary epitaxial layer lift-off/bonding technique.

FIG. 12 illustrates an exemplary epitaxial layer lift-off/bonding technique 1200. This technique can be used in the previously described process (1102 of FIG. 11) for attaching an epitaxial layer which may be a semiconductor laser to a tuning material. The epitaxial layer of a semiconductor wafer having a laser disposed in it may be lifted off and disposed upon a different substrate such as a tuning material. So that the laser may be disposed upon the tuning material. The exemplary technique is known as epitaxial lift-off/bonding technique 1200. A thin film layer like a semiconductor material 1201 consisting of an epitaxial layer ("epilayer") 1205 can be grown with a highly selective etching release layer 1207, which may be a thin Indium gallium arsenide layer (InGaAs), which is usually deposited on a substrate 1206, which may be a indium phosphide substrate. Epitaxial lift-off occurs by etching release layer 1207 releasing a laser structure from its substrate 1206 by a selective etchant 1209 as shown in diagram 1202. At 1202 the epitaxial layer is protected by disposed wax 1208 that may add mechanical strength.

At 1203 the epi-layer (semiconductor laser) 1205 with the wax 1208 acting as mechanical strength together form structure 1210, which then may be transferred and bonded to a new substrate, such as the tuning material 0203. The initial bonding typically occurs due to van der Waals forces between the epilayer 1205 and the tuning material 0203. In step 1204 when the clean and flat surfaces of two dissimilar materials are brought into close proximity there may form an intimate contact between different materials. When the epilayer 1205 and the tuning material 0203 are bonded, the wax 1208 can be removed by a solvent leaving the final structure as shown in step 1204. Such a method of attachment may be used to advantageously couple tunable materials to the tuning material. The strength of the adhesion typically depends on the type of material interaction. Though van der Waals forces may provide the initial attraction, the bonding strength can be increased in materials with appropriate heat treatment, specialized metals, epoxy or self assembled monolayers leading to the additional formation of covalent bonds across the bonding interface. These materials may be applied to the exposed epilayer surface 1205 and the exposed tuning material surface 0203 in diagram 1203 before the joining process in diagram 1205. These materials that promote adhesion may require additional processes or methods to make them couple the tunable material and the tuning material effectively.

Figure 13:
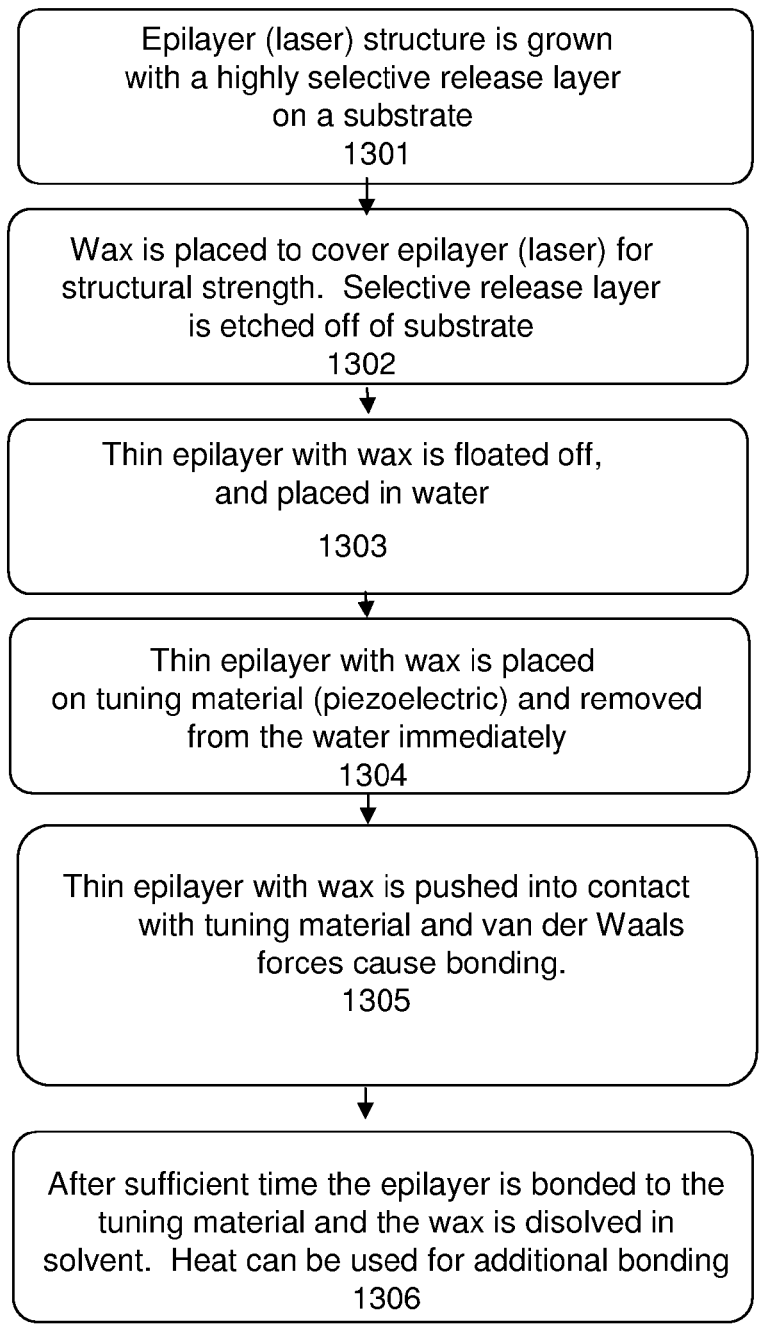
FIG. 13 is a flow chart of the epitaxial lift-off/bonding method.

FIG. 13 is a flow chart of the epitaxial lift-off/bonding method whereby a semiconductor laser may be intrinsically coupled to a tuning material as previously shown in FIG. 12. This process shows further details of the process block 1102 of FIG. 11. The epitaxial layer ("epilayer") lift-off process typically consists of two main components: 1) etching off and lift-off of epilayer (laser structure) with an etchant, and 2) van der Waals bonding of the epilayer to the tuning material.

The epilayer (laser structure) may be grown with a highly selective release layer on a substrate 1301. Wax may be placed to cover epilayer for structural strength, etching and lift-off of the thin epilayer (laser structure) off of the substrate with a highly selective release layer on substrate 1302. The thin epilayer with wax may be floated off after etching with highly selective etchant (acid) and then typically placed in water 1303. The thin epilayer with wax may be placed on the tuning material (piezoelectric) from the water immediately 1304. Before direct attachment it may be preferable to apply an adhesion layer to the exposed surfaces to promote bonding. The thin epilayer with wax may bond to the tuning material by van der Waals forces 1305. Just placing the two materials together in contact can form a strong bond. After sufficient time the epilayer may be bonded to the tuning material, and the wax may be dissolved in solvent. Heat can be used for additional bonding 1306. Though van der Waals forces may provide the initial attraction, the bonding strength can be increased in materials with appropriate heat treatment, specialized metals, epoxy or self assembled monolayers leading to the additional formation of covalent bonds across the bonding interface. These materials may be applied to the exposed epilayer and the exposed tuning material before the direct joining of the materials as in step 1304. These materials that promote adhesion may require additional processes or methods to make them couple the tunable material and the tuning material effectively. The resulting laser and piezoelectric assembly acts as a single monolithic device by this method of formation. Next an alternative method of coupling a tuning material to a tuned material will be examined.

Figure 14:
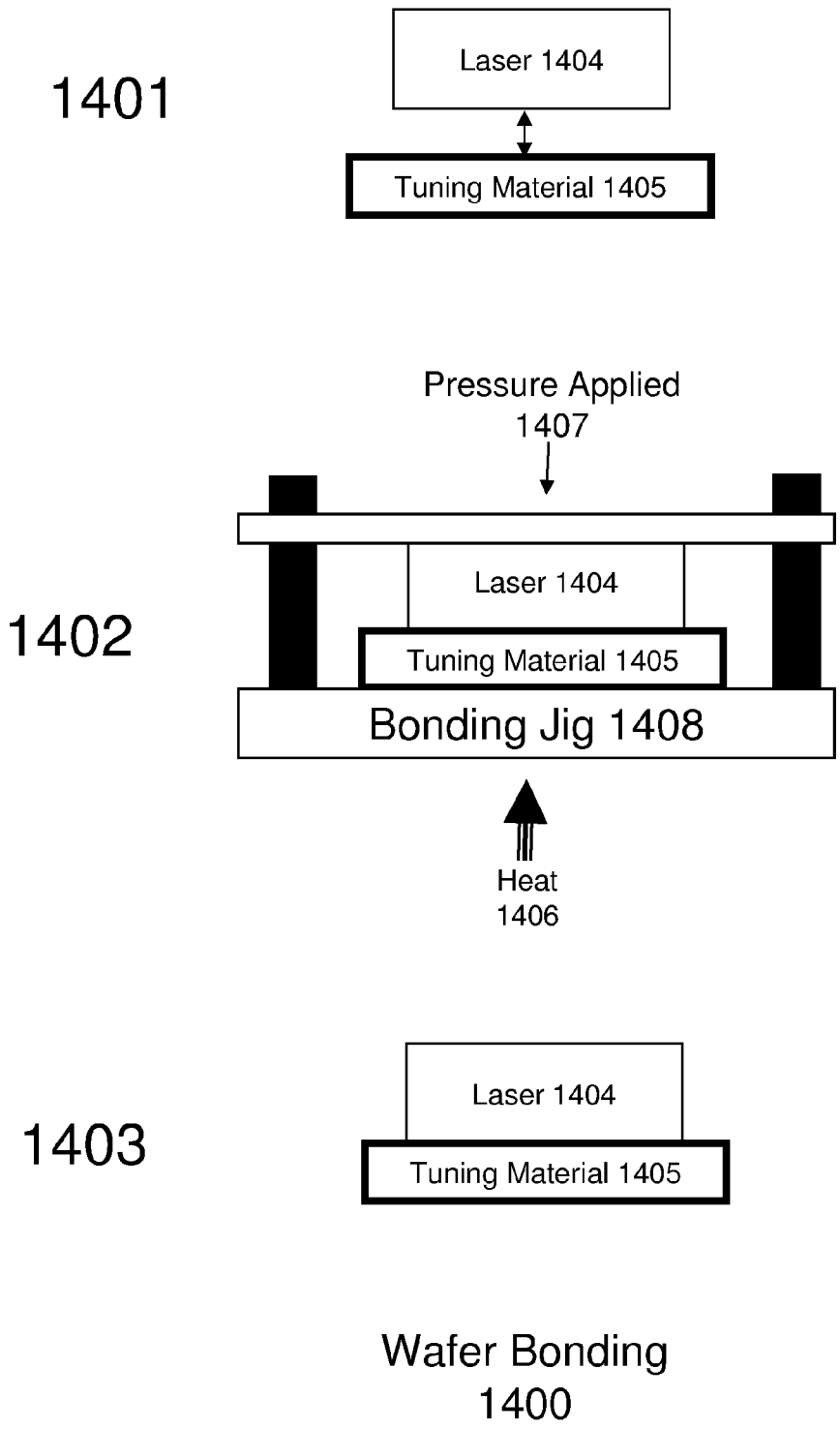
FIG. 14 shows merging the semiconductor laser and the tuning material by an alternative process of wafer bonding.

FIG. 14 shows merging the semiconductor laser and the tuning material (piezoelectric) (1102 of FIG. 11) by an alternative process of wafer bonding 1400. Wafer bonding can typically require a very clean oxide free laser 1404 and tuning material 1405 as in step 1401. In addition the surfaces are usually very smooth. Wafer bonding generally occurs in a clean environment because dust and particles may disrupt the process. The laser and tuning material may be typically placed in methanol or some equivalent solvent as in step 1401. The laser 1404 may be disposed onto the tuning material in a solution of methanol to prevent oxidation and then removed and placed in the bonding jig 1408 as in diagram 1402. Here the laser 1404 and tuning material 1405 are bonded using heat 1406 and pressure 1407 with what is typically called a "wafer bonder" or bonding jig 1408. Wafer bonding typically occurs with the application of heat 1406 and pressure 1407 over time as depicted in step 1402. The temperatures may vary considerably but may be as high as much as 450 degrees Celsius (° C.) or higher. The bonding strength may be increased in materials with use interfacial materials like glues, adhesives, metals, and self assembled monolayers between the two materials that are to be bonded. Additional use of intermediaries for adhesion may be applied in step 1401 before the laser and tuning material are placed in contact. The use of intermediaries may strengthen the bonding process. The final structure is typically strongly covalent bonded between the laser 1404 and the tuning material 1405 as shown in step 1403.

Figure 15:
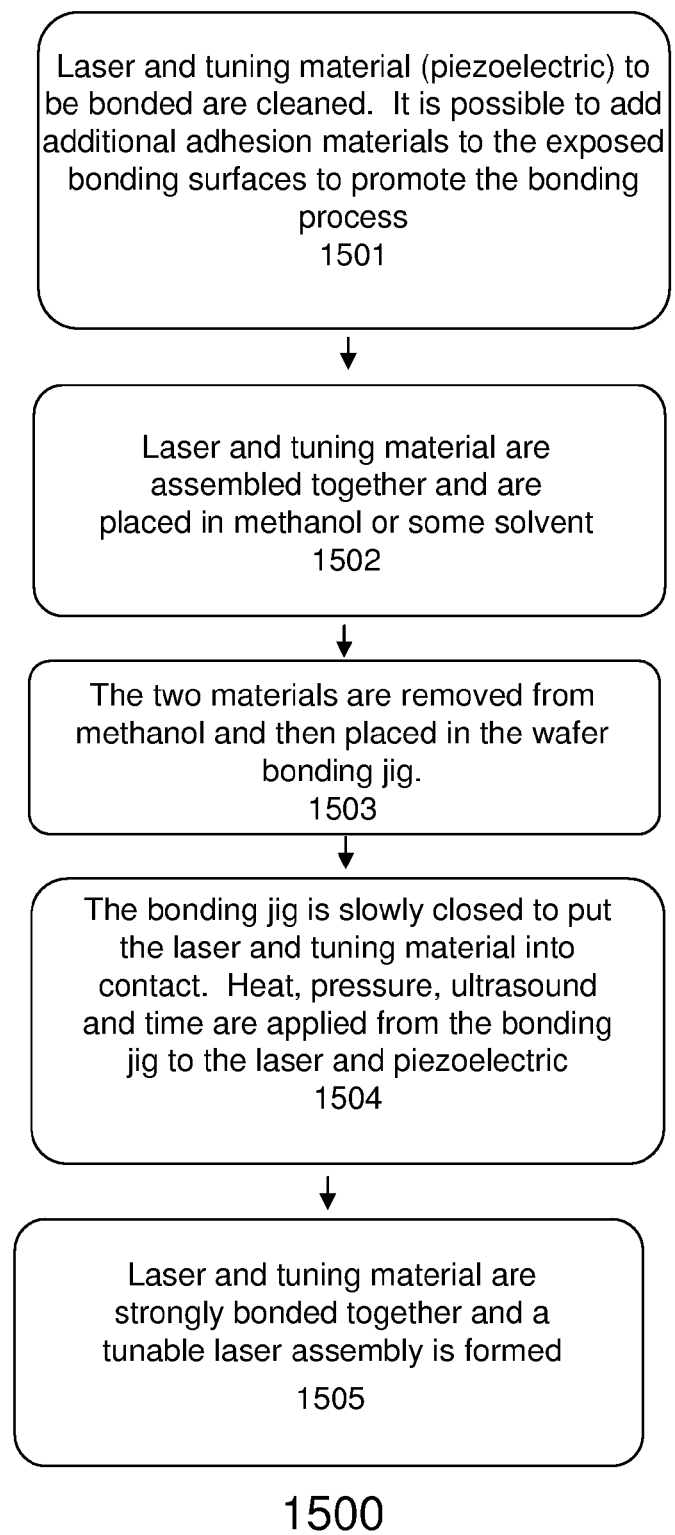
FIG. 15 is a flow chart showing the method of direct merging of the laser and the tuning material by wafer bonding.

FIG. 15 is a flow chart of wafer bonding 1500 which may result in strong bonding of the laser material to the piezoelectric. Laser and tuning material (piezoelectric) to be bonded may be cleaned 1501. This process typically ensures the strength of the bonding process. It is possible at this step to add adhesive materials to the exposed bonding surfaces of the laser and the tuning material the piezoelectric. Materials such as glues, metals and other intermediary layers may help to promote adhesion of the two materials. For example gold could be evaporated on one or both surfaces of the materials to be bonded. These materials that promote adhesion may require additional processes or methods to make them couple the tunable material and the tuning material effectively. The assembled materials may be placed together in methanol or some equivalent solvent 1502. The two materials may be placed in contact while in the methanol and then placed in the wafer bonding jig 1502. The bonding jig may be slowly closed to put the laser and tuning material into intimate contact. Heat, pressure, ultrasound and time may be applied by the bonding jig 1504 to the laser and tuning material. Laser and tuning material are strongly bonded together and a tunable laser assembly is formed 1505. Wafer bonding may result in a covalent bonding of the two materials, thus the two materials are typically fully monolithic and can act as one. After the laser and tuning materials are coupled together as a monolithic unit, the tuning material can be used to directly stress-strain the laser to change the output wavelength of the laser from its unstrained characteristic wavelength. Another method of disposing a tuning material on a tuned material may be by direct deposition, which will be described next.

Figure 16:
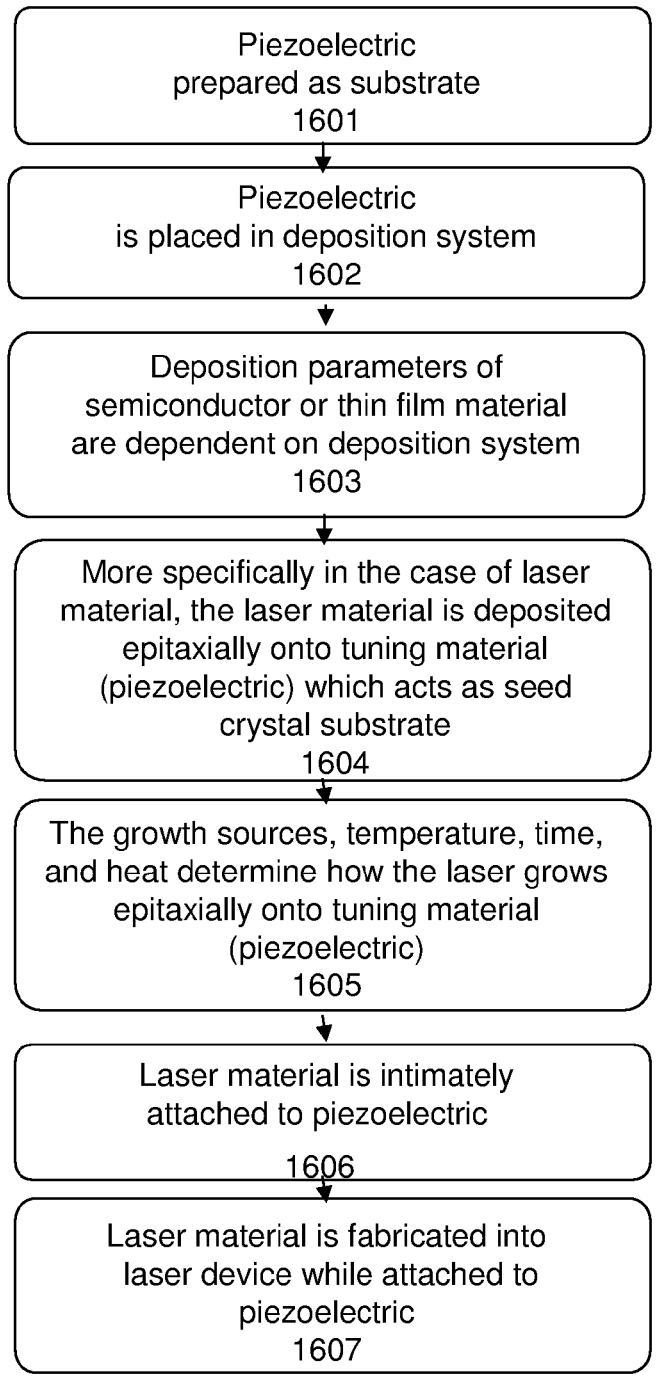
FIG. 16 is a flow chart describing a method of direct deposition 1600 of semiconductor or thin film material on the tuning material (piezoelectric), to form a tunable device assembly, without direct bonding or epitaxial lift-off.

FIG. 16 is a flow chart describing a method of direct deposition 1600 of semiconductor or thin film material on the tuning material (piezoelectric), to form a tunable device assembly, without direct bonding or transfer. The semiconductor or thin film material, after deposition, may be fabricated into a device which is fully adjoined or coupled to the piezoelectric. The piezoelectric crystal may be very smooth and cleaned and is typically prepared as substrate 1601. The piezoelectric crystal may be placed in a conventionally constructed deposition system 1602. The deposition system may be metalorganic chemical vapor deposition, molecular beam epitaxy, chemical beam epitaxy, evaporation, sputtering, spin-on or other equivalent types. Deposition parameters of semiconductor or thin film material may be determined dependent on the deposition system 1603. More specifically for semiconductor lasers, the laser material may be deposited epitaxially onto tuning material (piezoelectric) which may act as a seed crystal substrate 1604. Typically, the growth sources, temperature, time, and heat can determine how the laser grows epitaxially onto the tuning material (piezoelectric) 1605, but other growth parameters may be relevant. Laser material is typically intimately coupled to piezoelectric 1606. Laser material may be fabricated into laser device while coupled to piezoelectric 1607. Electrodes may be disposed on piezoelectric for biasing. The laser may be electrically biased, which would require electrical contacts, or optically pumped, which would not require electrical contacts. As previously mentioned, devices other than lasers may be tuned in alternative examples. An alternative method to the above consists of depositing the piezoelectric directly on the laser material. The procedure is similar to the above steps except the laser may be the seed substrate. Both these methods result in a monolithic tunable laser structure.

The adjoining or coupling method 1100 of FIG. 11 may be a method of making a compact tunable laser assembly. The following methods may form a monolithic tunable laser assembly: epitaxial layer lift-off/bonding technique 1200 of FIG. 12, wafer bonding 1400 of FIG. 14, and direct deposition of semiconductor or thin film material on the tuning material 1600 of FIG. 16. Other types of devices such as transistors may have the outputs of the device tuned by a similar methodology of disposing tuning material onto the transistor.

Figure 17:
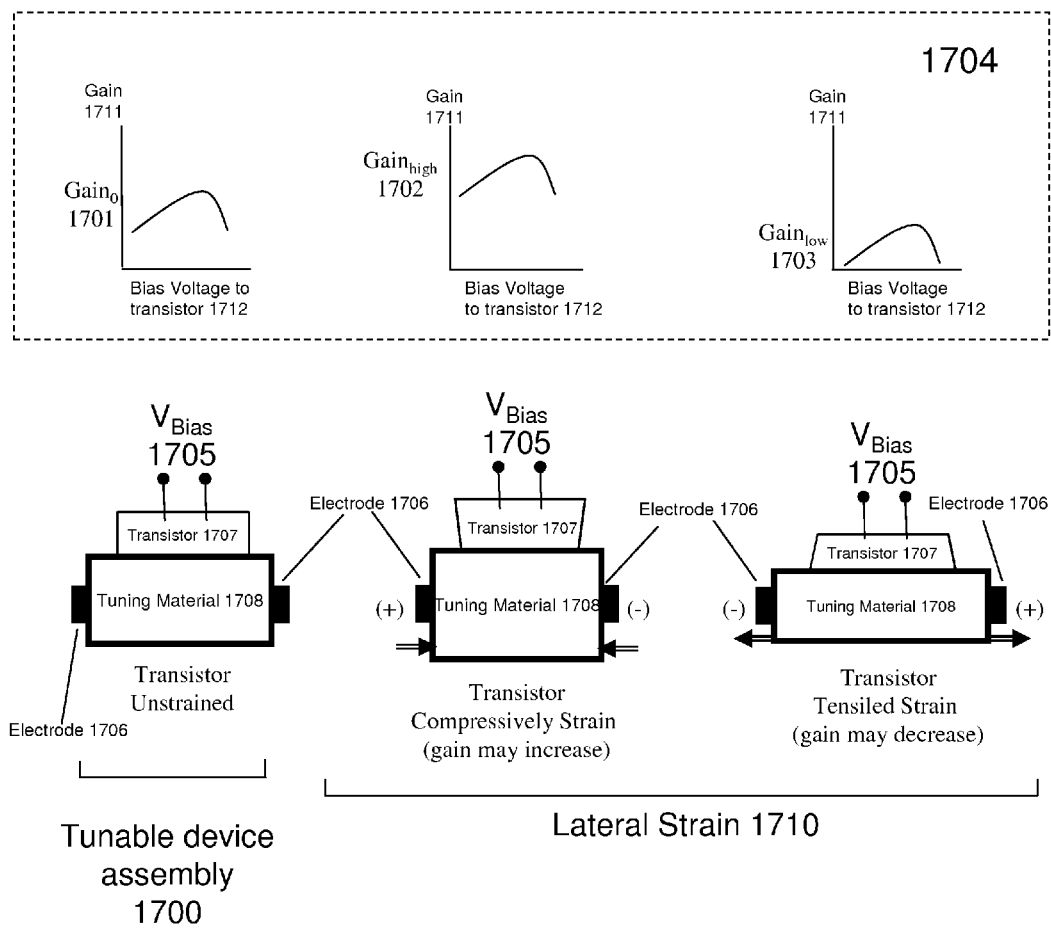
FIG. 17 shows an example of a tunable device assembly to make a variable gain transistor.

FIG. 17 illustrates an example of a tunable device assembly 1700 wherein the device to be strained and thus tuned is a transistor 1707. This figure illustrates variations of the tunable device assembly method previously described in this disclosure which may be applicable to this transistor 1707 and other equivalent devices. The transistor 1707 is coupled to a tuning material 1708 such as an exemplary piezoelectric, by a bonding, adjoining or coupling technique, or equivalent. The transistor can be of a semiconductor origin, thin film, or polymer based or any other exemplary type. This figure shows a side view of an example of a tunable device assembly 1700 with an applied lateral strain 1710 as inducing a change in the gain of the transistor and the depicted transistor gain characteristic graphically showing the change in gain of the transistor 1704. The side view drawing of the different transistor operations correspond to the above graphical depictions of the corresponding gain out put 1704.

In this example a transistor 1707 which can be coupled, typically by direct attachment, to a tuning material 1708 such as an exemplary piezoelectric, by wafer bonding, gluing, or by utilizing an intermediary adhesive material such as gold metal in the wafer bonding process, but not limited by these techniques.

Typically the transistor 1707 may be input controlled by a bias voltage ($V_{bias}$) 1705, though other methods such as current bias and other variations may be used for input control. These methods may be operated in DC, pulsed, synchronous, or asynchronous modes of operation. The transistor with the application of $V_{bias}$ 1705 may output a characteristic gain curve ("$Gain_0$") 1701. The dotted box 1704 depicts a possible gain output 1711 of the transistor, showing a shift in the gain curve of the transistor due to stress-strain. The box 1704 shows typical transistor characteristics in a graphical plot of gain 1711 verses the bias voltage applied to the transistor 1712. The side view drawings of the different transistor stress-strain operations correspond to the above graphical depictions of the corresponding Gain curves 1704.

When the transistor is unstressed-unstrained such as when no bias is applied to the tuning material, a characteristic output gain curve ($Gain_0$) 1701 is generated. As a voltage may be applied to electrode contacts 1706 to the tuning material 1708, depending on the polarity, the tuning material 1708 may undergo compressive stress-strain, which may be transferred to the transistor which may cause the output of gain of the transistor to increase 1702. Similarly, if the applied voltage is such that the tuning material 1708 experiences tensile stress-strain, which may be transferred to the transistor, the output gain of the transistor may decrease 1703. It may be possible that the sequence of the application of strain to the transistor may be different then described. This method described may be useful for any thin film material or devices.

Materials that may be applicable for this procedure would include thin film transistors, liquid crystal material, organic or polymer components that are used in thin film and light emitting structures, dielectrics and so on. The polymer or organic materials could be directly spun on the tuning material directly in a further variation of an adjoining method. Since the base is crystalline the transfer of strain directly through to the polymer organic may be almost completely transferred. One example could be to use such a device for changing the color of liquid crystal displays by having the liquid crystal bonded to the piezoelectric and then deformations in the piezoelectric would change the apparent color of the crystal. Another variation is to deposit by spinning on or evaporating organic material that makes the components of an organic LED onto the tuning material. The organic thin films would undergo the full strain as the tuning material deformation from compression would affect the output light wavelength characteristics. This technique can generally accommodate any thin film material that has properties that are strain dependent.

It is typically noted that the laser can be replaced in the examples described by any device whose device parameters or outputs are stress-strain sensitive, and by replacing the laser in the above geometries (as shown in FIG. 17) by that device it is possible to make that device fully and precisely tunable to control the device parameters or outputs of interest.

The following figures show additional features of the tunable device assembly.

Figure 18:
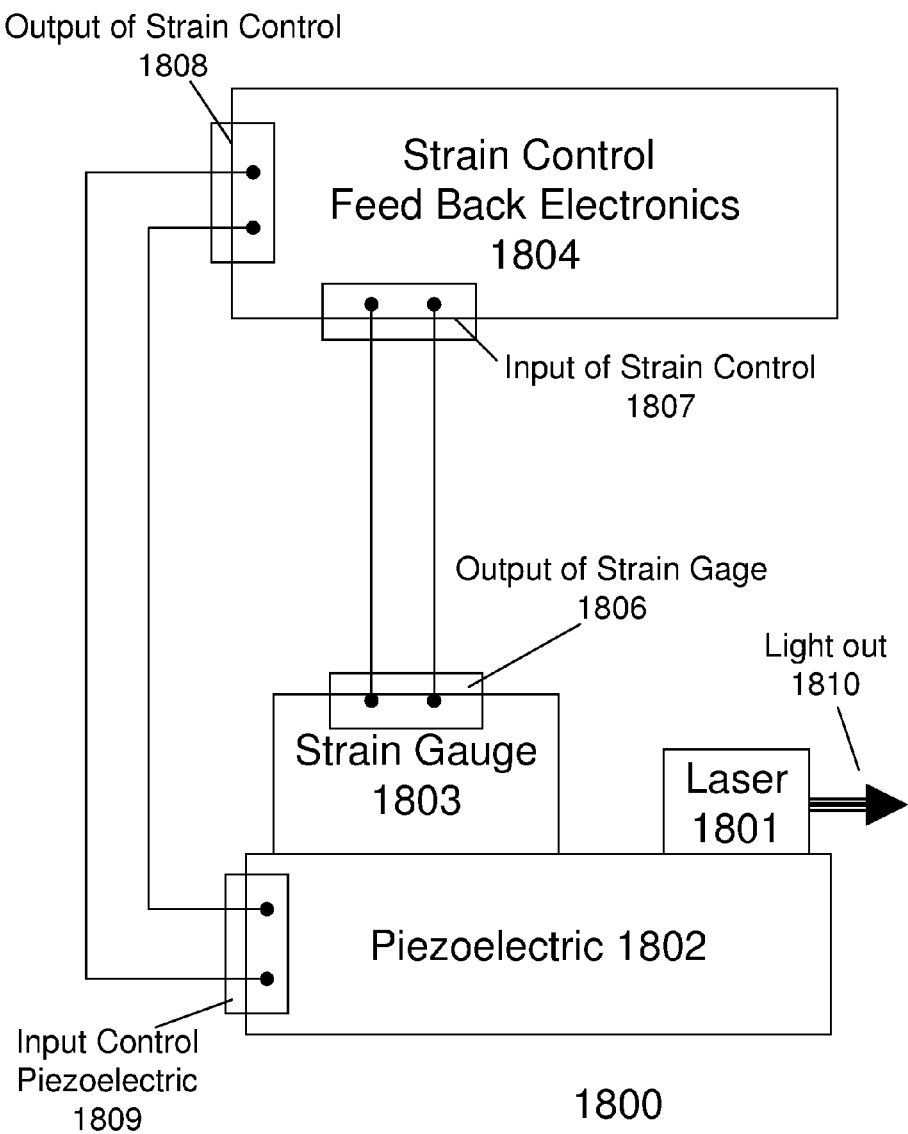
FIG. 18 shows a schematic block diagram of a tunable laser assembly plus strain gage feedback control.

FIG. 18 shows a schematic block diagram of a tunable laser assembly plus strain gage feedback control 1800. For feedback control to ensure the precise deformation of the piezoelectric 1802, the tunable laser may be integrated with a conventional calibrated movement sensor (strain gage sensor) 1803 that can be operated in a closed loop feed back circuit for typically very accurate movement control. The strain gage sensor can be calibrated to accurately measure very precise movements of the piezoelectric or any material that deforms. The laser 1801 may be disposed on the piezoelectric 1802. A strain gage 1803 is disposed on the piezoelectric, typically by a conventional gluing technique. The strain gage 1803 sensor can precisely measure the deformation of the piezoelectric 1802, because as the element is strained, the resistance of the strain gage material typically behaves in a well controlled manner. Any deviation or drift from the correct strain of the piezoelectric 1802 may be detected by the strain gage 1803, and an output of the strain gage 1806 which may be a voltage relayed to the input of strain control 1807. The conventional strain control feedback electronics 1804 may utilize a conventional phase lock loop to deliver a correction signal, output of the strain control

1808, which may be a voltage. The output of the strain control 1808 is then relayed to the input control of the piezoelectric 1809, which will then be adjusted to stabilize the position or deformation of the piezoelectric. Because the laser 1801 may be very sensitive to stress-strain, any erroneous displacement of the piezoelectric 1802 may cause an incorrect shift in the light out 1810. Such a circuit integrated to the tunable laser would assist in wavelength stability of the laser. A wavelength meter (not shown) to measure the light out 1810 of the laser 1801 could be used independently or for additional input to the strain control 1807. If a wavelength meter is used to measure the wavelength of the light out 1810, then it may be possible to use the output from the wavelength meter to control the output of the strain control 1808 to deliver the precise input control of the piezoelectric 1809 to deform the piezoelectric 1802 to deliver the correct strain to the laser 1801 to deliver the correct light out 1810 wavelength.

Figure 19:
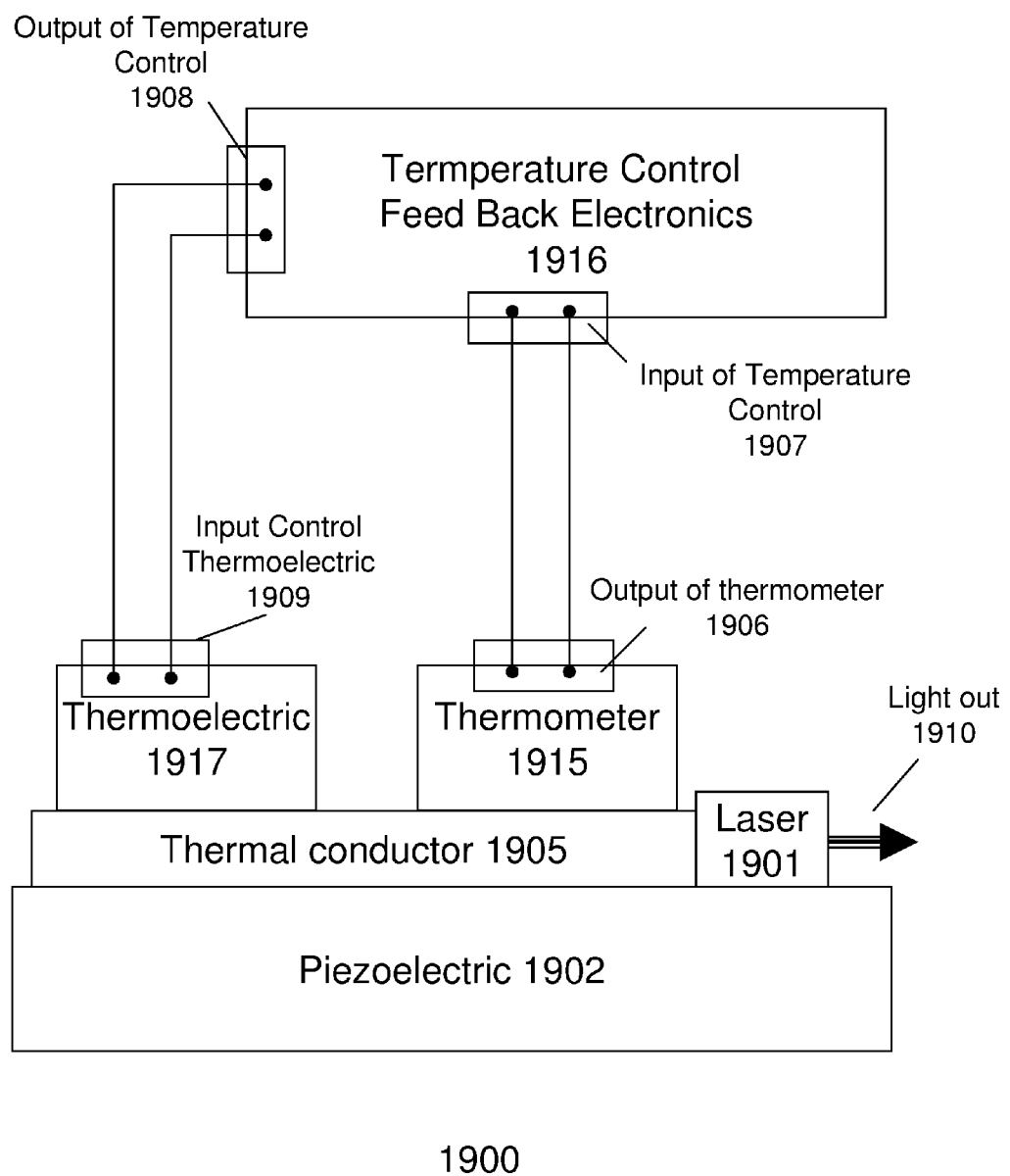
FIG. 19 shows a block diagram of a tunable laser plus thermoelectric temperature feedback control.

FIG. 19 shows a block diagram of a tunable laser plus thermoelectric temperature control 1900. The laser 1901 may have some temperature dependent properties, thus to eliminate potential problems a feedback temperature control circuit may be useful to stabilize the temperature of for the tunable laser. The conventionally constructed thermometer 1915 may be a calibrated resistor with a known temperature dependence. As the temperature changes the output of the thermometer 1906, which may be a resistance, will shift and be relayed to the input of the conventionally or custom constructed temperature control 1907. The temperature control feedback electronics 1916 may utilize a conventionally constructed phase lock loop to deliver a correction signal at the output of the temperature control 1908, which may be a voltage, which is then relayed to the input control 1909 of the thermoelectric 1917, which then adjusts the heating or cooling power. The thermoelectric 1917, thermometer 1915 and the laser 1901 may be directly thermally linked together by a conventional thermal conductor 1905. Such a circuit integrated to the tunable laser would typically assist in wavelength stability of the laser, ensuring the light out 1910 may be stable. A wavelength meter (not shown) to measure the light out 1910 of the laser 1901 may be used independently or for additional input of the temperature control 1907. If a wavelength meter is used to measure the wavelength of the light out 1910, then it may be possible to use this output signal from the wavelength meter to control the output of the temperature control 1908, to deliver the precise input control of the thermoelectric 1909, to increase or decrease the heating power to the thermal conductor 1905, to correct for stress-strain wavelength shifts of the light out 1910 of the laser 1901.

Various methods of feedback control have been described in FIG. 18 and FIG. 19. These methods have been utilizing a piezoelectric for strain control of the laser and a thermoelectric for temperature control of the laser. The input control parameters for the strain control electronics 1804 for the case where a piezoelectric 1802 is used have been strain gage 1803 or output wavelength of the laser. The input control parameters for the temperature control electronics 1916, for the case where a thermoelectric 1917 is used, have been output of the thermometer 1906 or output wavelength of the laser. It is typically noted that these are not the only methods of feedback control and one method does not preclude the other. The strain control feedback electronics and the temperature control electronics could also be employed together to get both control of strain (and/or stress) and temperature of the laser. Also the inputs used for feedback can utilize other elements and are not limited to the methods or devices described.

A further adaptation of the methods of feedback control involve using the strain control as a method of crude wavelength and using the temperature control as a method of fine tuning the wavelength of light emitted from the laser. This method can be a variation of combining both FIG. 18 and FIG. 19 for wavelength control of the laser. Generally because stress-strain can dramatically affect the output of the laser, strain control could be used as a rapid method of achieving the desired wavelength of the laser. The input control for the strain control feedback electronics could be either the output of the strain gage and/or the wavelength light output from the laser, but coarse input control is not limited to these techniques. Generally because temperature shifts in the laser allow for small shifts in output wavelength, it may be possible to utilize temperature control of the laser to produce fine control of the output wavelength. The input control for the temperature control feedback electronics could be either the output of the thermometer and/or the wavelength light output from the laser, but the fine input control is not limited to these techniques. This method can be an additional variation to control the output wavelength of the laser. It is typically noted that these examples in no way limit the scope and coverage of this patent.

One of many possible applications of employing the tunable laser described may be in the area of telecommunications. One area that this tunable laser may offer considerable advantages are in wavelength division multiplexing (WDM) for telecommunication applications. WDM is a possible method to increase the bandwidth of a given fiber-optic cable. This technique may require the transmission of signals at different wavelengths, which may require a fixed wavelength laser at each wavelength. If single wavelength lasers are used, this scheme adds cost and complexity because many additional lasers need to be manufactured and monitored. The tunable laser described above could possibly alleviate this problem, because this single tunable laser could possibly replace any number of fixed wavelength lasers, offering a significant reduction in cost and complication. Typically a method like this could be called one-time provisioning.

Additional applications in telecommunications for the tunable laser described may be for dynamic reconfiguration. High-speed communications can be interrupted by a failure of an optical link. In WDM systems this may require back-up lasers at each wavelength to prevent significant down time. A tunable laser as described above may be a cost effective solution as the back-up allowing for remote reconfiguration and allow for immediate fixes. In one example the back-up laser can be a compact or monolithic tunable laser, as described above.

The compact or monolithic tunable laser as described could be possibly used for adding optical networking functionality. For example, the compact or monolithic tunable laser with a tunable filter allows for selective choice of signals to be added or dropped, thereby lowering cost and making better use of bandwidth. In addition, it may be possible to provide for the dynamic allocation between the transmitting node and the receiving node to be streamlined with the use of a compact or monolithic tunable laser and filter because all the signals are transparent except for the signal of interest.

For highly secured fiber optic applications the compact or monolithic tunable laser described, which could be employed in a frequency hopping or wavelength hopping mode method, similar to spread spectrum communications. In this example, the compact or monolithic tunable laser would send signals at a prescribed sequence of specific wavelengths that may be based on a key, thus encryption of the signal at different wavelengths. Also a time key may be employed, which would designate at a given time which wavelength the signal may be sent, then a very secure communication method may be developed that would further increase the security of fiber optic systems. In this example even if the optical fiber carrying the wavelength of light is cut and spliced with a spying device, the intruder would need to know the encryption key to interpret the signal being transmitted through the optical fiber. Also the use of the compact or monolithic tunable laser would allow for sending of false signals at a variety of wavelengths to further encrypt the data.

These applications of the compact or monolithic tunable laser are just possible applications and do not limit this patent in any way.

The following figures show possible implementation of the compact or monolithic tunable laser assembly for telecommunications.

Figure 20:
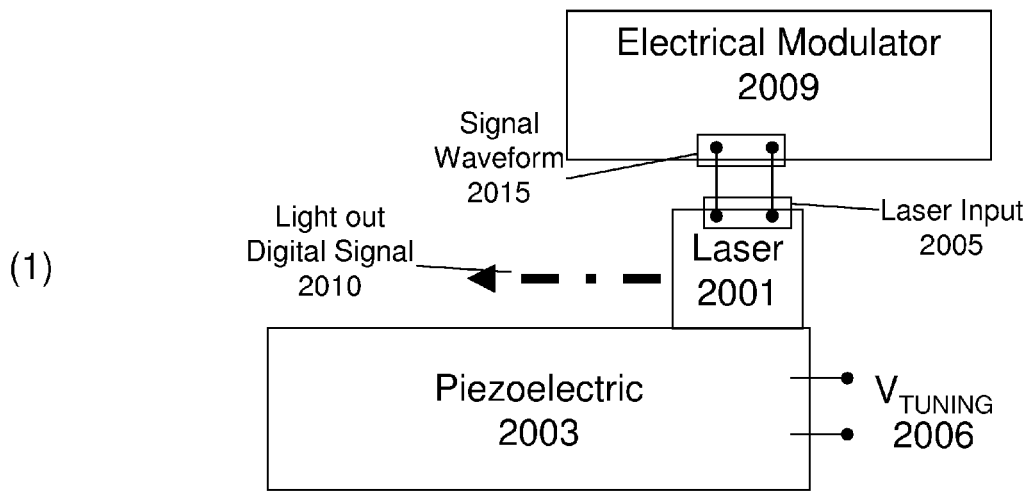
FIG. 20 shows a block diagram of the possible uses of the tunable laser assembly for applications in telecommunications.
Figure 20:
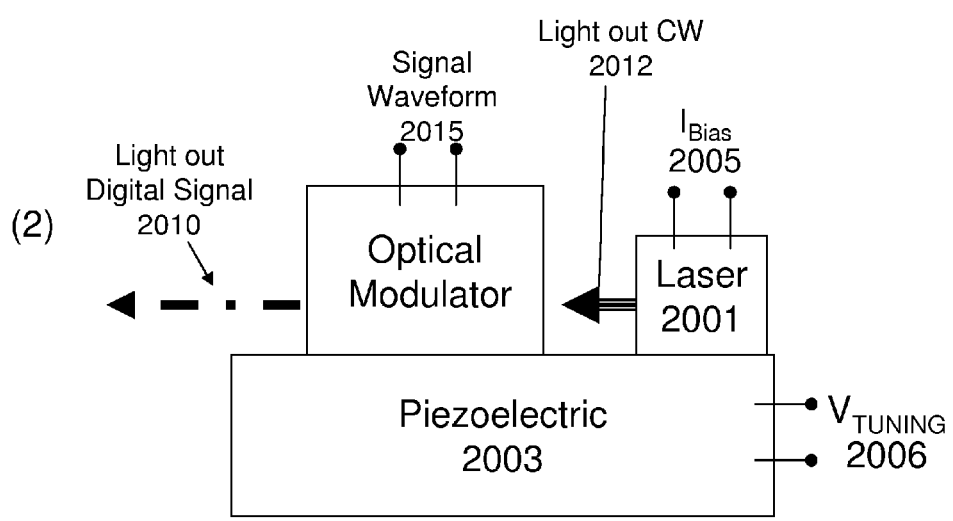

FIG. 20 shows a block diagram of the possible use of the tunable laser assembly for applications in telecommunications, such as wavelength division multiplexing (WDM), but not limited to these applications. Example (1) shows an electrical modulator with tunable laser assembly 2020. The conventional electrical modulator 2009 provides the signal waveform 2015, which may consist of on-off current pulses, which can be sent to the laser input 2005. The laser's light out may then consist of digital signals 2010. The wavelength of the laser 2001 may be changed by the application of a voltage $V_{tuning}$ 2006 to the piezoelectric 2003, which will cause a strain from the piezoelectric to the laser. By being able to send digital light pulses and also the capability of changing the wavelength allows the possibility of this laser system 2020 to be used in telecommunication WDM or dense wavelength division multiplexing (DWDM).

Example (2) shows a conventional optical modulator with tunable laser assembly 2030. One possible method of sending digital photonic data with this laser system is to apply an $I_{bias}$ to the laser, in CW operation. Thus the light intensity is typically relatively constant with the application of voltage $V_{tuning}$ 2006 to the piezoelectric 2003 results in a deformation of the piezoelectric which due the coupling of the laser may be directly applied to the laser, thus possibility causing a wavelength shift. The light output from the laser 2001 is light out CW 2012. This light is then sent to the optical modulator 2040 which has the signal waveform 2015 applied to its input. This may result in the direct modulation of the CW light out 2012 from the laser 2001. Thus it is possible to produce a digitized light signal 2010 with the added advantage that the wavelength of light may be changed thus offering the possibility of use in DWDM telecommunications systems. By no means are these two examples encompassing and many other variations are possible.

The tunable devices and their methods of manufacture and use disclosed herein may be implemented in a variety of examples. Therefore, the foregoing discussion of these examples does not represent a complete description of all possible examples. As an example of an additional example, the tunable lasers disclosed herein can be capable of outputting any wavelength of light and are not limited to outputting light in the visible spectrum. Accordingly, the disclosure of examples herein is intended to be illustrative of the scope of the disclosure and is not intended to limit the appended claims. Instead, the scope of the invention shall be limited only to the extent that may be required by the appended claims.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific examples. The benefits, advantages, solutions to problems, and any element or elements that may cause any benefit, advantage, or solution to occur or become more pronounced, however, are not to be construed as critical, required, or essential features or elements of any or all of the claims.

The invention claimed is:

1. A tunable device comprising:
   a first tuning material which has stress-strain dependent properties;
   a tunable material coupled to the first tuning material and capable of being stressed-strained by the first tuning material to adjust an output of the tunable material;
   a second tuning material which has stress-strain dependent properties and is coupled to the tunable material and at a different side of the tunable material than the first tuning material; and
   a clamp having a first jaw coupled to a side of the first tuning material, and a second jaw coupled to a side of the second tuning material;
   wherein the tunable material is capable of being stressed-strained by the second tuning material and the clamp to adjust the output of the tunable material.

2. The tunable device of claim 1, wherein:
   the tunable material comprises a portion of a laser; and
   the adjustment of the output of the tunable material comprises tuning the laser.

3. The tunable device of claim 1, wherein the first tuning material and the second tuning material are piezoelectric.

4. A tunable device comprising:
   a first tuning material which has stress-strain dependent properties;
   a tunable material coupled to the first tuning material and capable of being stressed-strained by the first tuning material to adjust an output of the tunable material; and
   a second tuning material coupled to the tunable material;
   wherein the first tuning material and the second tuning material are deformed by one or more compressive stress-strains; and
   wherein the tunable material is deformed by the one or more compressive stress-strains from the first tuning material and the second tuning material.

5. The tunable device of claim 4,
   wherein the tunable device has a monolithic structure.

6. The tunable device of claim 4, further comprising:
   a temperature sensor coupled to the first tuning material; and
   temperature control feedback electronics coupled to the temperature sensor and the first tuning material.

7. The tunable device of claim 4, wherein the tunable device is portable.

8. The tunable device of claim 4, wherein the first tuning material is piezoelectric.

9. A tunable device comprising:
   a first tuning material which has stress-strain dependent properties;
   a tunable material coupled to the first tuning material and capable of being stressed-strained by the first tuning material to adjust an output of the tunable material; and
   a second tuning material coupled to the tunable material;
   wherein:
   the first tuning material is deformed by a tensile stress-strain;
   the second tuning material is deformed by a compressive stress-strain; and
   wherein the tunable material is deformed by the compressive stress-strain from the first tuning material and the tensile stress-strain from the second tuning material.

10. The tunable device of claim 9, wherein:
the tunable material comprises a portion of a laser; and
the adjustment of the output of the tunable material comprises tuning the laser.

11. The tunable device of claim 10, wherein the portion of the laser further comprises an active region selected from the group consisting of a homojunction active region, a heterojunction active region, a quantum well active region, and a quantum cascade active region.

12. The tunable device of claim 10, wherein:
the laser comprises a quantum heterostructure laser, and
the first tuning material comprises a piezoelectric material.

13. The tunable device of claim 9, wherein the first tuning material is piezoelectric.

14. The tunable device of claim 9, wherein the first tuning material comprises a voltage controlled or current controlled tuning material.

15. A tunable device comprising:
a first tuning material which has stress-strain dependent properties;
a tunable material coupled to the first tuning material and capable of being stressed-strained by the first tuning material to adjust an output of the tunable material; and
a second tuning material adjacent to the tunable material and comprised of a material different from the first tuning material;
wherein the tunable material is capable of being stressed-strained by the second tuning material to adjust the output of the tunable material.

16. The tunable device of claim 15, wherein:
the tunable material comprises at least a portion of a laser;
the first tuning material comprises an input to receive at least one of a voltage or a current; and
the first tuning material is configured such that receiving the at least one of the voltage or the current at the input changes the stress-strain dependent properties of the first tuning material.

17. The tunable device of claim 15, wherein the first tuning material is piezoelectric.

18. A tunable device comprising:
a first tuning material which has stress-strain dependent properties;
a tunable material coupled to the first tuning material and capable of being stressed-strained by the first tuning material to adjust an output of the tunable material;
a stress-strain gauge coupled to the first tuning material; and
stress-strain control feedback electronics coupled to the stress-strain gauge and the first tuning material.

19. The tunable device of claim 18, wherein the first tuning material is piezoelectric.

20. The tunable device of claim 19, wherein the tunable device has a monolithic structure.

21. A tunable device comprising:
a first tuning material which has stress-strain dependent properties;
a tunable material integrated with the first tuning material and capable of being stressed-strained by the first tuning material to adjust an output of the tunable material; and
a second tuning material integrated with the tunable material;
wherein the first tuning material and the second tuning material are deformed by one or more tensile stress-strains; and
wherein the tunable material is deformed by the one or more tensile stress-strains from the first tuning material and the second tuning material.

22. The tunable device of claim 21, wherein the first tuning material is piezoelectric.

23. The tunable device of claim 22, wherein the second tuning material is piezoelectric.

24. The tunable device of claim 21, wherein the first tuning material comprises a first voltage controlled or first current controlled tuning material; and
the second tuning material comprises a second voltage controlled or second current controlled tuning material.

25. The tunable device of claim 21, wherein the tunable device has a monolithic structure.

* * * * *

UNITED STATES PATENT AND TRADEMARK OFFICE
CERTIFICATE OF CORRECTION

| | | |
|---|---|---|
| PATENT NO. | : 7,830,926 B1 | Page 1 of 1 |
| APPLICATION NO. | : 11/938637 | |
| DATED | : November 9, 2010 | |
| INVENTOR(S) | : Matthew H. Kim | |

It is certified that error appears in the above-identified patent and that said Letters Patent is hereby corrected as shown below:

At column 26, line 13, delete "19" and insert --18--.

Signed and Sealed this
Eighth Day of March, 2011

David J. Kappos
*Director of the United States Patent and Trademark Office*